US010763110B2

(12) United States Patent
Aktas et al.

(10) Patent No.: US 10,763,110 B2
(45) Date of Patent: Sep. 1, 2020

(54) METHOD AND SYSTEM FOR FORMING DOPED REGIONS BY DIFFUSION GALLIUM NITRIDE MATERIALS

(71) Applicant: QROMIS, Inc., Santa Clara, CA (US)

(72) Inventors: Ozgur Aktas, Pleasanton, CA (US); Vladimir Odnoblyudov, Danville, CA (US); Cem Basceri, Los Gatos, CA (US)

(73) Assignee: QROMIS, INC., Santa Clara, CA (US)

( * ) Notice: Subject to any disclaimer, the term of this patent is extended or adjusted under 35 U.S.C. 154(b) by 0 days.

(21) Appl. No.: 16/271,704

(22) Filed: Feb. 8, 2019

(65) Prior Publication Data

US 2019/0252186 A1    Aug. 15, 2019

Related U.S. Application Data

(60) Provisional application No. 62/629,588, filed on Feb. 12, 2018.

(51) Int. Cl.
*H01L 21/22*    (2006.01)
*H01L 21/02*    (2006.01)
(Continued)

(52) U.S. Cl.
CPC .... *H01L 21/02579* (2013.01); *H01L 21/0242* (2013.01); *H01L 21/0254* (2013.01); *H01L 21/0262* (2013.01); *H01L 21/02428* (2013.01); *H01L 21/02458* (2013.01); *H01L 21/02642* (2013.01); *H01L 21/22* (2013.01);
(Continued)

(58) Field of Classification Search
None
See application file for complete search history.

(56) References Cited

U.S. PATENT DOCUMENTS

2002/0001864 A1    1/2002   Ishikawa et al.
2013/0161634 A1*   6/2013   Disney ............... H01L 29/0619
                                                          257/76
(Continued)

OTHER PUBLICATIONS

International Search Report and Written Opinion of the International International Application Searching Authority dated Apr. 26, 2019 in corresponding No. PCT/US2019/017358 (14 pages).

*Primary Examiner* — Bradley Smith
(74) *Attorney, Agent, or Firm* — Kilpatrick Townsend & Stockton LLP

(57) ABSTRACT

A method of forming doped regions by diffusion in gallium nitride materials includes providing a substrate structure including a gallium nitride layer and forming a mask on the gallium nitride layer. The mask exposes one or more portions of a top surface of the gallium nitride layer. The method also includes depositing a magnesium-containing gallium nitride layer on the one or more portions of the top surface of the gallium nitride layer and concurrently with depositing the magnesium-containing gallium nitride layer, forming one or more magnesium-doped regions in the gallium nitride layer by diffusing magnesium into the gallium nitride layer through the one or more portions. The magnesium-containing gallium nitride layer provides a source of magnesium dopants. The method further includes removing the magnesium-containing gallium nitride layer and removing the mask.

21 Claims, 14 Drawing Sheets

(51) Int. Cl.
*H01L 29/66* (2006.01)
*H01L 29/06* (2006.01)
*H01L 29/20* (2006.01)
*H01L 29/205* (2006.01)
*H01L 29/207* (2006.01)
*H01L 29/861* (2006.01)
*H01L 29/778* (2006.01)
*H01L 29/872* (2006.01)

(52) U.S. Cl.
CPC ...... *H01L 29/0619* (2013.01); *H01L 29/2003* (2013.01); *H01L 29/205* (2013.01); *H01L 29/207* (2013.01); *H01L 29/66143* (2013.01); *H01L 29/66212* (2013.01); *H01L 29/66462* (2013.01); *H01L 29/7786* (2013.01); *H01L 29/8613* (2013.01); *H01L 29/872* (2013.01)

(56) References Cited

U.S. PATENT DOCUMENTS

| | | | |
|---|---|---|---|
| 2013/0214251 A1* | 8/2013 | Balkenende | H01L 21/0237 257/13 |
| 2013/0242627 A1 | 9/2013 | Bedell et al. | |
| 2014/0151748 A1* | 6/2014 | Nishimori | H01L 29/42316 257/194 |
| 2017/0170317 A1* | 6/2017 | Sichler | H01L 29/0649 |
| 2017/0200614 A1* | 7/2017 | Mahajan | H01L 21/3081 |
| 2018/0029944 A1 | 2/2018 | Subramanian et al. | |
| 2018/0047840 A1* | 2/2018 | Nakamura | H01L 21/02381 |
| 2019/0279901 A1* | 9/2019 | Lin | H01L 21/76814 |

* cited by examiner

METHOD AND SYSTEM FOR FORMING DOPED REGIONS BY DIFFUSION GALLIUM NITRIDE MATERIALS

CROSS-REFERENCES TO RELATED APPLICATIONS

This application claims priority to U.S. Provisional Patent Application No. 62/629,588, filed on Feb. 12, 2018, the disclosure of which is hereby incorporated by reference in its entirety for all purposes.

BACKGROUND OF THE INVENTION

Gallium-nitride-based semiconductor devices, such as p-n diodes, p-i-n diodes, Schottky diodes, high electron mobility transistors (HEMTs), can be applied to a variety of power systems, such as solar inverters, compact power supplies (e.g., power factor correction circuits or PFC), switch-mode power supplies (SMPS), motor drives, RF power amplifiers, solid state lighting (SSL), smart grid, and automotive motor drive systems. Accordingly, there is a need in the art for improved methods and systems related to forming gallium-nitride-based semiconductor devices.

SUMMARY OF THE INVENTION

Embodiments of the present invention relate to semiconductor materials. More particularly, methods and systems related to diffusion of dopants into gallium nitride materials are provided by embodiments of the present invention.

According to an embodiment of the present invention, a method of forming doped regions by diffusion in gallium nitride materials is provided. The method includes providing a substrate structure including a gallium nitride layer and forming a mask on the gallium nitride layer. The mask exposes one or more portions of a top surface of the gallium nitride layer. The method also includes depositing a magnesium-containing gallium nitride layer on the one or more portions of the top surface of the gallium nitride layer and concurrently with depositing the magnesium-containing gallium nitride layer, forming one or more magnesium-doped regions in the gallium nitride layer by diffusing magnesium into the gallium nitride layer through the one or more portions. The magnesium-containing gallium nitride layer provides a source of magnesium dopants. The method further includes removing the magnesium-containing gallium nitride layer and removing the mask.

According to another embodiment of the present invention, a method of forming doped regions in gallium nitride materials is provided. The method includes providing a gallium nitride substrate structure. The gallium nitride substrate structure includes a buffer layer formed on a substrate, a first epitaxial gallium nitride layer formed on the buffer layer, a second epitaxial gallium nitride layer formed on the first epitaxial gallium nitride layer, and an epitaxial aluminum gallium nitride layer formed on the second epitaxial gallium nitride layer. The method also includes forming a mask on the epitaxial aluminum gallium nitride layer. The mask exposes one or more portions of a top surface of the epitaxial aluminum gallium nitride layer. The method further includes depositing a magnesium-containing gallium nitride layer on the one or more portions of the top surface of the epitaxial aluminum gallium nitride layer and concurrently with depositing the magnesium-containing gallium nitride layer, forming one or more magnesium-doped regions in the epitaxial aluminum gallium nitride layer by diffusing magnesium into the epitaxial aluminum gallium nitride layer through the one or more portions. The magnesium-containing gallium nitride layer provides a source of magnesium dopants. Additionally, the method includes removing the magnesium-containing gallium nitride layer and removing the mask.

According to another embodiment of the present invention, a method of forming doped regions by diffusion in gallium nitride materials is provided. The method includes providing a substrate structure including a gallium nitride layer, forming a mask on the gallium nitride layer, the mask exposing one or more portions of a top surface of the gallium nitride layer, and depositing a magnesium-containing gallium nitride layer on the one or more portions of the top surface of the gallium nitride layer. The method also includes annealing the substrate structure to form one or more magnesium-doped regions in the gallium nitride layer by diffusing magnesium into the gallium nitride layer through the one or more portions. The magnesium-containing gallium nitride layer provides a source of magnesium dopants for the annealing process. The method further includes removing the magnesium-containing gallium nitride layer and removing the mask.

According to another specific embodiment of the present invention, a method of forming doped regions in gallium nitride materials is provided. The method includes providing a gallium nitride substrate structure. The gallium nitride substrate structure includes a buffer layer formed on a substrate, a first epitaxial gallium nitride layer formed on the buffer layer, a second epitaxial gallium nitride layer formed on the first epitaxial gallium nitride layer, and an epitaxial aluminum gallium nitride layer formed on the second epitaxial gallium nitride layer. The method also includes forming a mask on the epitaxial aluminum gallium nitride layer. The mask exposes one or more portions of a top surface of the epitaxial aluminum gallium nitride layer. The method further includes depositing a magnesium-containing gallium nitride layer on the one or more portions of the top surface of the epitaxial aluminum gallium nitride layer and annealing the gallium nitride substrate structure to form one or more magnesium-doped regions in the epitaxial aluminum gallium nitride layer by diffusing magnesium into the epitaxial aluminum gallium nitride layer through the one or more portions. The magnesium-containing gallium nitride layer provides a source of magnesium dopants for the annealing process. The method also includes removing the magnesium-containing gallium nitride layer and removing the mask.

DETAILED DESCRIPTION OF SPECIFIC EMBODIMENTS

The present invention relates generally to methods of forming doped regions by diffusion in gallium nitride materials. Doping refers to the process of intentionally introducing impurities into a semiconductor material in order to change its electrical properties. Doping can be achieved, for example, by either diffusion or ion implantation. In a diffusion process, a semiconductor wafer may be kept in a high temperature quartz tube furnace, and an appropriate gas mixture is passed. The dopant sources can be gaseous sources, liquid sources, or solid sources. The diffusion coefficient may depend exponentially on temperature, for example, in the form of $$D = D^0 \exp\left(-\frac{E^D}{kT}\right),$$

where k is the Boltzmann constant, T is temperature, and $E^D$ is an activation energy.

It is generally thought that diffusion is difficult to achieve in GaN materials, perhaps because of stronger atomic bonds and thus higher activation energies associated with such materials. Therefore, a large amount of investment has been spent on ion implantation facilities for introducing dopants into GaN materials. Ion implantation processes, however, may cause more damage to the GaN materials as compared to diffusion processes, and therefore may degrade device performance. Diffusion in GaN materials may occur at very high temperatures, for example, at 900° C. or greater. At such high temperatures, the GaN materials may decompose, thus making it difficult to achieve high quality devices.

According to some embodiments of the present invention, magnesium (Mg) diffusion may be achieved in GaN materials by using solid sources at growth temperatures. For example, a magnesium-containing GaN layer may be formed on an epitaxial GaN layer or an epitaxial AlGaN layer in an MOCVD chamber at a deposition temperature. The magnesium in the magnesium-containing GaN layer may diffuse into the epitaxial GaN layer or the epitaxial AlGaN layer as the magnesium-containing GaN layer is being deposited. The magnesium-containing GaN layer may protect the underlying GaN layer or AlGaN layer from decomposition while magnesium is being diffused into the epitaxial GaN layer or the epitaxial AlGaN layer. After diffusion is achieved, the magnesium-containing GaN layer may be removed. Some exemplary processes of using Mg diffusion to make GaN-based devices are discussed in more detail below. Although diffusion into epitaxial III-V-based layers (e.g., GaN or AlGaN epitaxial layers), the present invention is not limited to diffusion into epitaxial layers and diffusion into bulk layers can be implemented using embodiments of the present invention.

Figure 1:
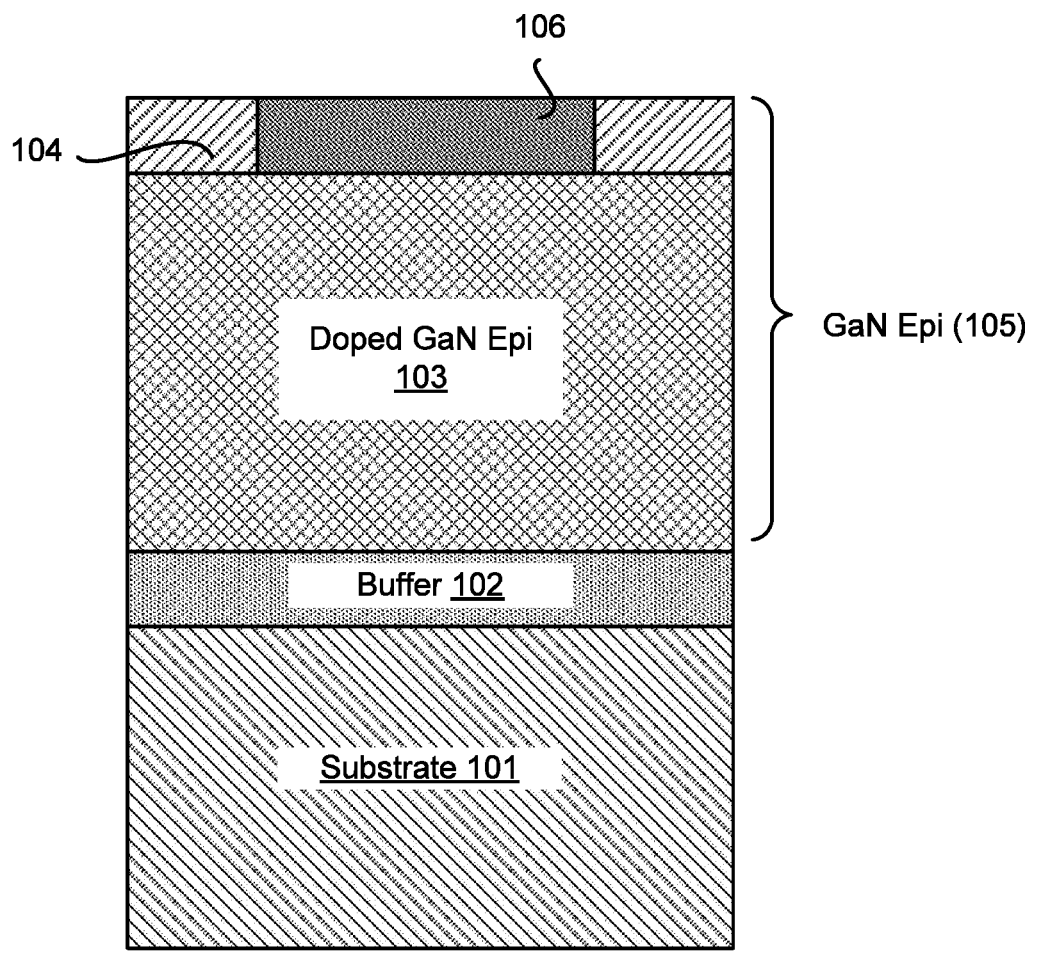
FIG. 1 is a simplified schematic diagram illustrating an engineered substrate structure according to some embodiments of the present invention.

FIG. 1 is a simplified schematic cross-sectional diagram illustrating a diffused region in GaN materials according to an embodiment of the present invention. As described herein, embodiments of the present invention provide methods and system for fabricating electronic devices with doped regions formed by diffusion. In FIG. 1, substrate 101, which may include one or more materials, e.g., a GaN substrate, a sapphire substrate, a silicon carbide substrate, a silicon substrate, a gallium oxide substrate, or combinations thereof, is used as a substrate for epitaxial growth of buffer layer 102, doped GaN epitaxial layer 103, and undoped GaN epitaxial layer 104. Doped GaN epitaxial layer 103 and undoped GaN epitaxial layer 104 can be referred to as GaN epitaxial layer 105.

Doped region 106 is formed by diffusion of a dopant (e.g., magnesium as a p-type dopant) into the undoped GaN epitaxial layer 104. In the illustrated embodiment, doped region 106 has a thickness approximately equal to the thickness of the undoped GaN epitaxial layer 104, but this is not required by the present invention and in other embodiments, the doped region is thinner or thicker (extending into the doped GaN epitaxial layer 103. Additional description related to the fabrication of the structure illustrated in FIG. 1 is provided in relation to FIGS. 2A-2D.

FIGS. 2A-2D are simplified schematic cross-sectional diagrams illustrating intermediate steps in a method of forming doped regions in GaN materials by diffusion according to some embodiments of the present invention.

Figure 2A:
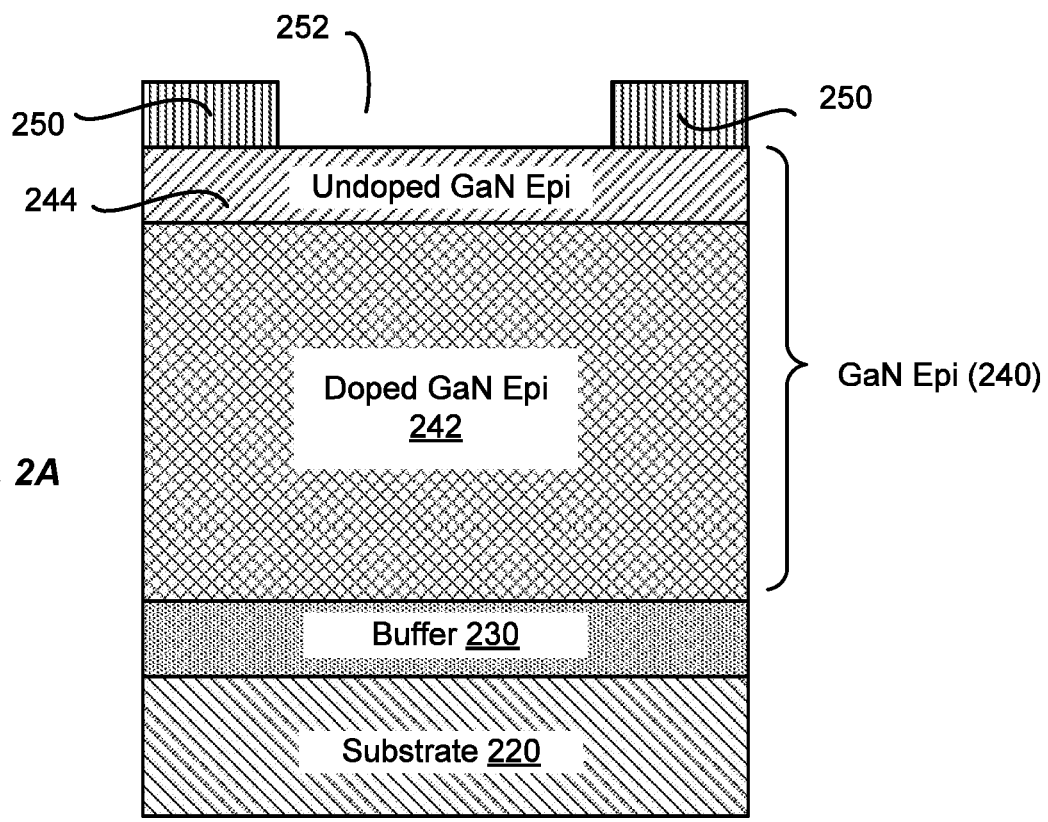
FIGS. 2A-2D are simplified schematic cross-sectional diagrams illustrating intermediate steps in a method of forming doped regions in GaN materials by diffusion according to some embodiments of the present invention.
Figure 8:
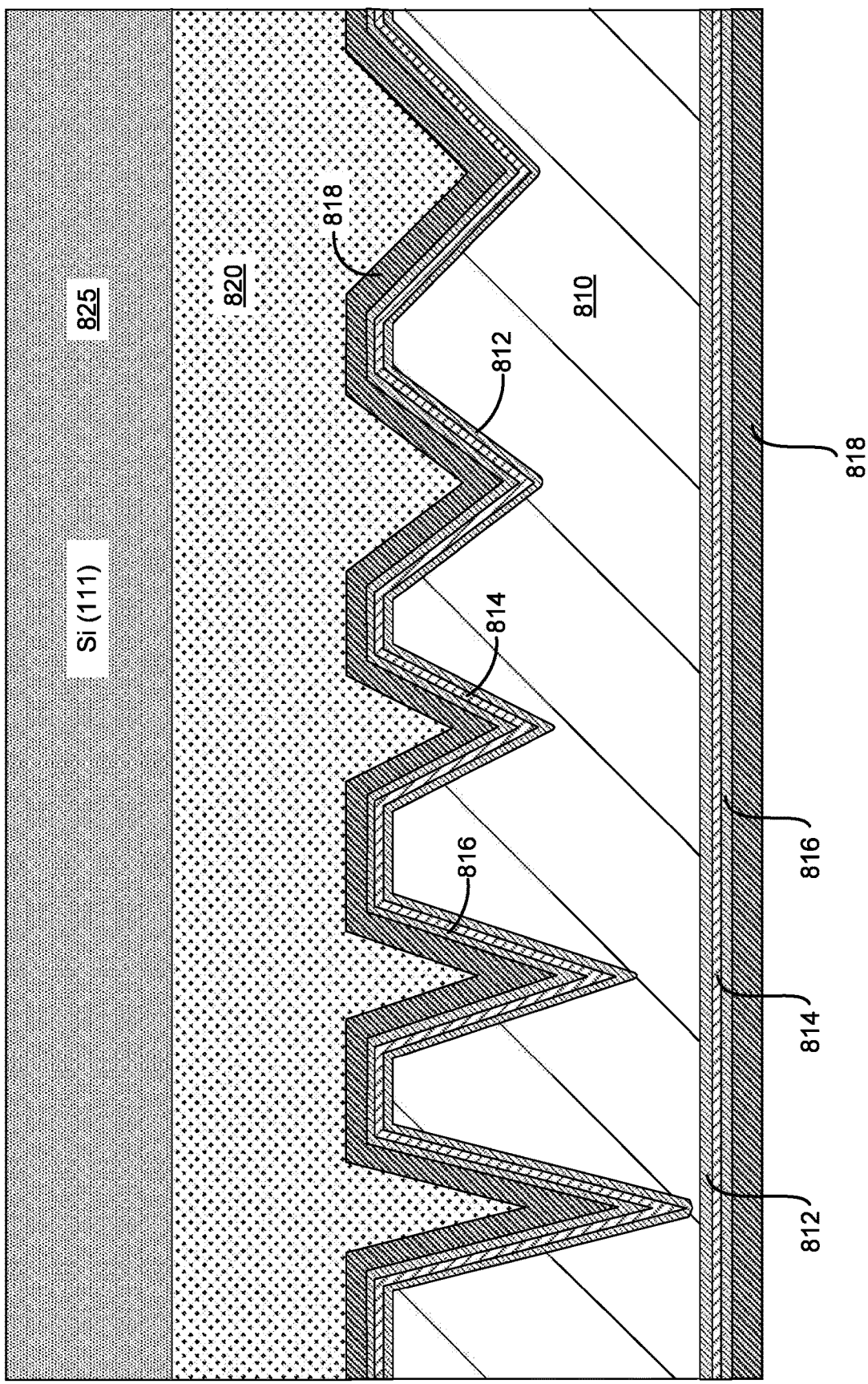
FIG. 8 is a simplified schematic diagram illustrating an engineered substrate structure according to some embodiments of the present invention.

Referring to FIG. 2A, a substrate 220 is provided. The substrate 220 may be an engineered substrate structure as illustrated in FIG. 8. If an engineered substrate structure is utilized, it may include a ceramic substrate with a thin silicon (Si) layer formed thereon. The substrate provides a surface for epitaxial growth.

A buffer layer 230 may be epitaxially formed on the substrate 220. The buffer layer 230 may include one or more layers. In some embodiments, the buffer layer 230 may be relatively thin, for example less than 0.5 micron in thickness. The buffer layer 230 may include, for example, AlN about 0.2 μm in thickness, $Al_{0.25}Ga_{0.75}N$ about 0.125 μm in thickness, combinations thereof, or the like. A relatively thin aluminum-containing buffer layer (e.g., 0.2 AlN/0.125 μm $Al_{0.25}Ga_{0.75}N$) can support more than 8 microns of GaN epitaxy on a large diameter substrate, which cannot be fabricated using silicon substrates.

An epitaxial GaN layer 240 may be formed on the buffer layer 230. In some embodiments, the epitaxial GaN layer 240 may have a thickness that is greater than 8 μm for high voltage resistance. For example, a breakdown voltage greater than 500 V or 600 V may be achieved in the power devices subsequently formed on the epitaxial GaN layer 240. As illustrated in FIG. 2A, the epitaxial GaN layer 240 may include a doped epitaxial GaN layer 242 and an undoped GaN epitaxial layer 244. The doped epitaxial GaN layer 242 may have a thickness of 5 μm or greater. The doped epitaxial GaN layer 242 may include C- or Fe-doped GaN in some embodiments to provide for high resistance. As discussed more fully herein, low conductivity layers can be formed such as C—GaN or Fe—GaN layers, which may have background doping levels (free carriers density) on the order of $1\times10^{12}$ cm$^{-3}$ as the carbon or iron compensates for the background impurities or provides deep centers.

Although GaN layers are discussed herein, the present invention is not limited to GaN and other III-V materials can be utilized, including AlGaN, InGaN, InAlGaN, combinations thereof, and the like. One of ordinary skill in the art would recognize many variations, modifications, and alternatives.

Because the substrate 220 may have a CTE that is substantially matched to the CTE of the epitaxial GaN layer 240, a relatively thin buffer layer 230 (e.g., less than 0.5 μm) can support a relative thick epitaxial GaN layer 240 (e.g., more than 5 μm).

Referring to FIG. 2A, a mask 250 may be formed on the undoped epitaxial GaN layer 244. The mask 250 may have a pattern that includes one or a plurality of windows 252 exposing a plurality of portions of a top surface of the undoped epitaxial GaN layer 244. The mask 250 may include a photoresist, for example.

Figure 2B:
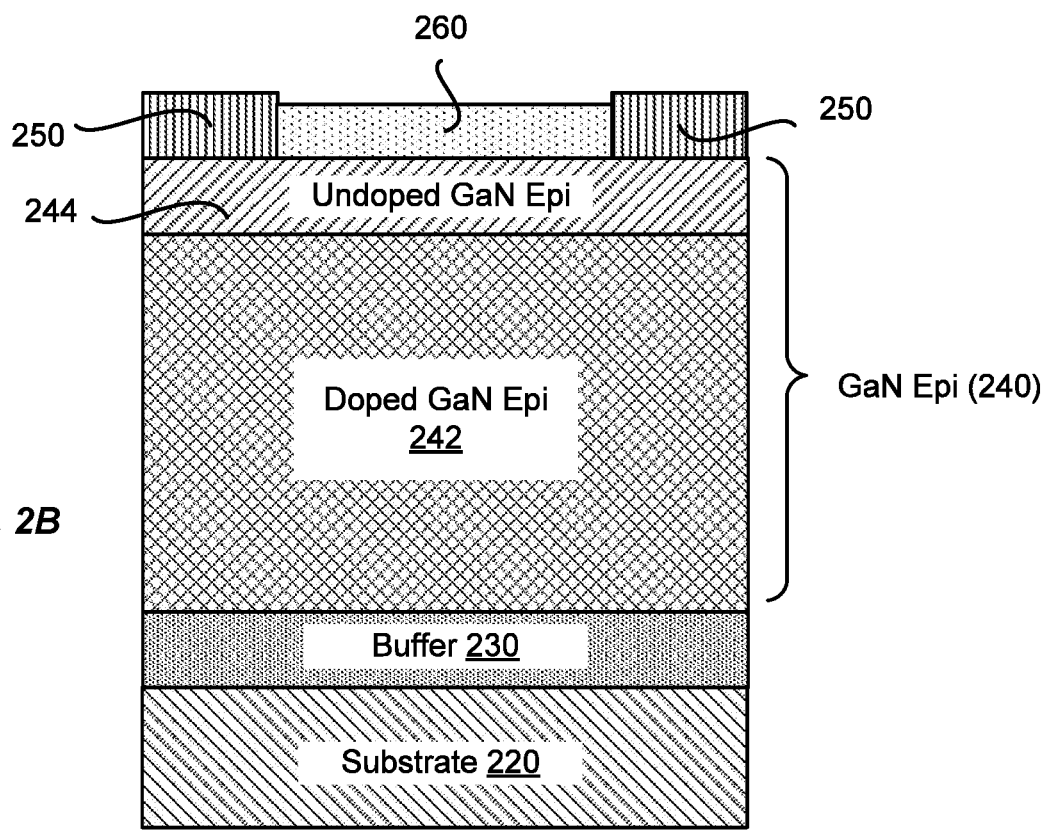
Figure 2C:
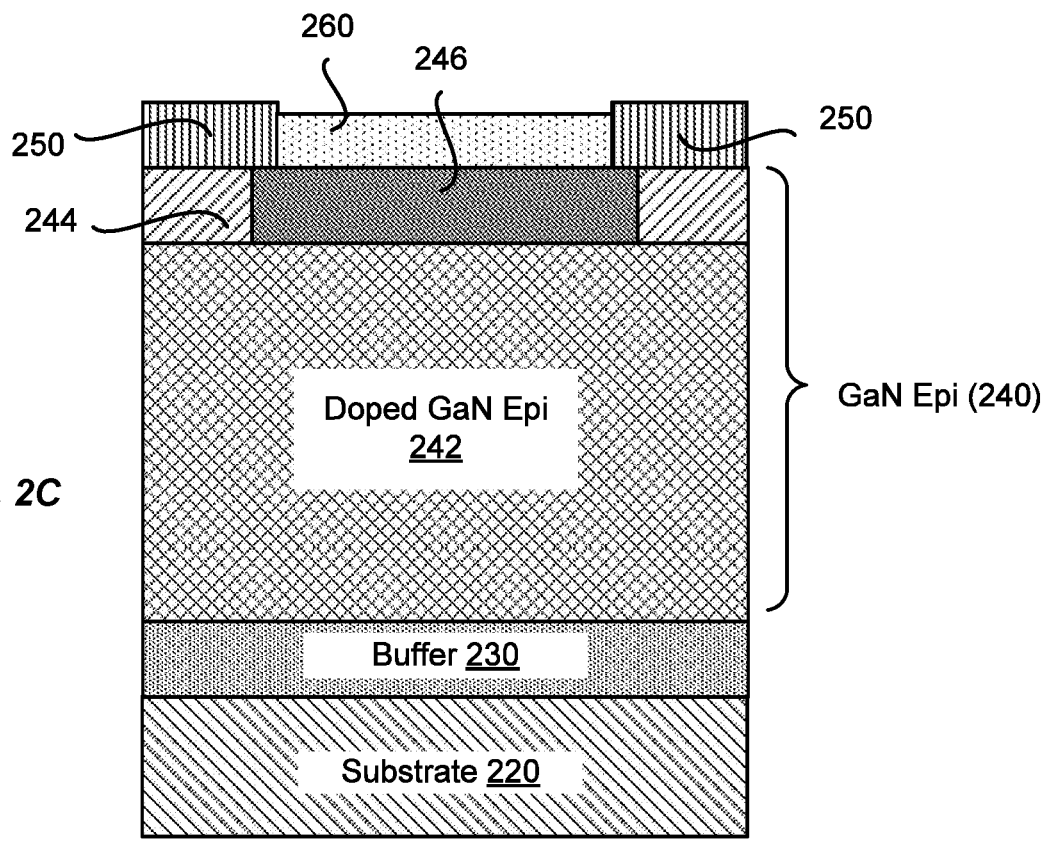

The structure may then be placed in a thin film growth chamber, for example an MOCVD chamber. Referring to FIG. 2B, a magnesium-containing GaN layer 260 may be formed on the plurality of exposed portions of the top surface of the undoped epitaxial GaN layer 244 at a deposition temperature in a process similar to an MOCVD process. The deposition temperature may be in a range from about 900° C. to about 1100° C. In some embodiments, the magnesium density in the magnesium-containing gallium nitride layer 260 may be approximately from $1\times10^{19}$ cm$^{-3}$ to $1\times10^{20}$ cm$^{-3}$. At such high temperatures and high magnesium density, magnesium may diffuse into the undoped epitaxial GaN layer 244 through the windows 252 of the mask 250 to form a plurality P-type doped regions 246 in the undoped epitaxial GaN layer 244, as illustrated in FIG. 2C. Here, the magnesium-containing GaN layer 260 may serve as a solid source of magnesium dopants, and may not be a high quality epitaxial layer. The presence of the magnesium-containing GaN layer 260 also protects the underlying undoped epitaxial GaN layer 244 from decomposition during the diffusion process.

Figure 2D:
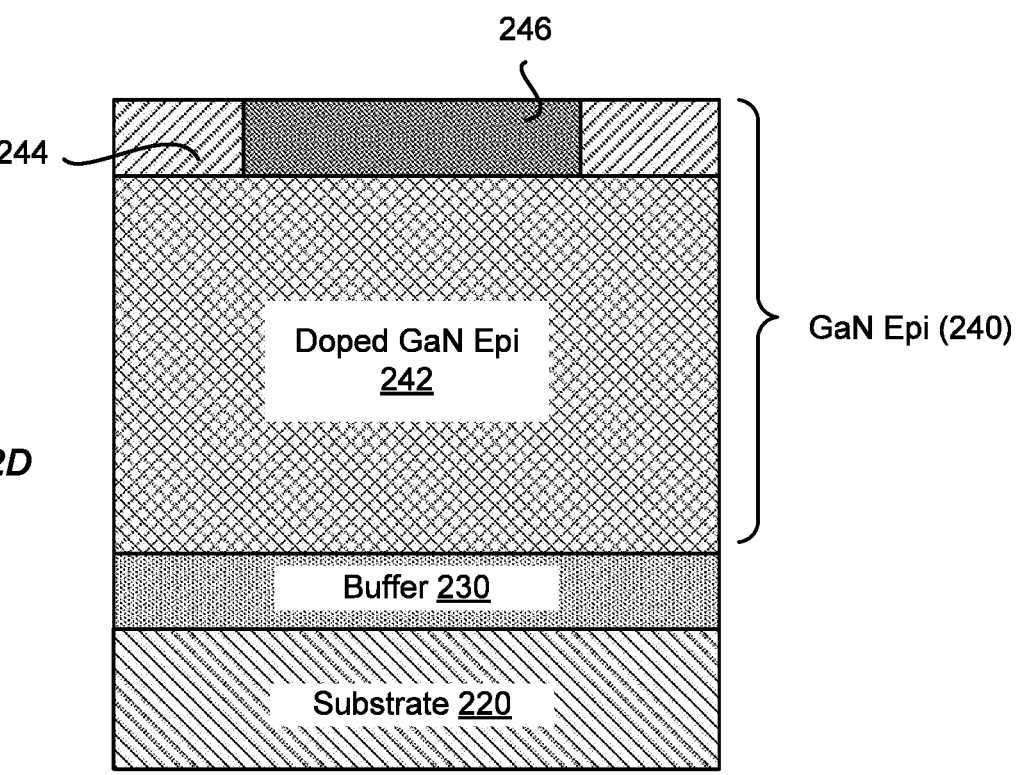

After diffusion has been achieved, the magnesium-containing GaN layer 260 and the mask 250 may be removed, as illustrated in FIG. 2D. The magnesium-containing GaN layer 260 and the mask 250 may be removed using an acid, such as hydrochloric acid or sulfuric acid. In some embodiments, the magnesium dopants may diffuse to the interface between the undoped epitaxial GaN layer 244 and the doped epitaxial GaN layer 242, resulting in a P-type doped region 246 that is as thick as the undoped epitaxial GaN layer 244, as illustrated in FIG. 2D. The interface between the P-type doped region 246 and the doped epitaxial GaN layer 242 may form a p-n junction of a power device. In some other embodiments, one or more P-type doped regions 246 may form edge termination regions in a vertical Schottky diode. In some further embodiments, one or more P-type doped regions 246 may form parts of a vertical MPS diode. In some embodiments, magnesium may diffuse laterally beyond a window 252 of the mask 250, resulting in a P-type doped region 246 that extends laterally under a portion of the mask 250 as illustrated in FIG. 2C. Such lateral extension under the mask 250 usually does not occur in an ion implantation process. Although p-type doping of an undoped region is illustrated in FIGS. 2A-2D, other embodiments provide for p-type doping of an n-type region to reduce the doping level from a first n-type dopant density to a reduced dopant density. Moreover, although p-type doping using magnesium is illustrated in FIGS. 2A-2D, other p-type dopants can be utilized. Furthermore, n-type doping using an n-type dopant can be utilized in a manner similar to the p-type doping process illustrated herein. One of ordinary skill in the art would recognize many variations, modifications, and alternatives.

Figure 3A:
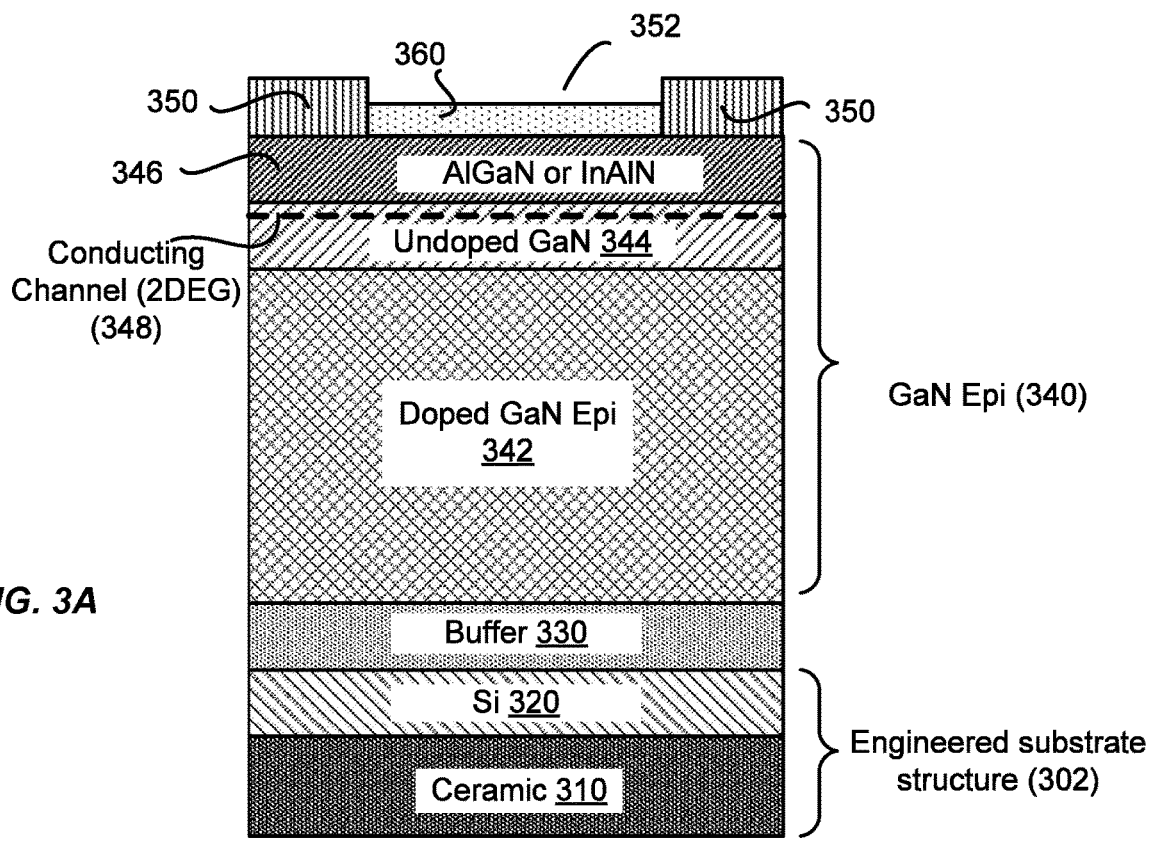
FIGS. 3A and 3B are simplified schematic cross-sectional diagrams illustrating intermediate steps in a method of forming doped regions in GaN materials by diffusion according to some other embodiments of the present invention.
Figure 3B:
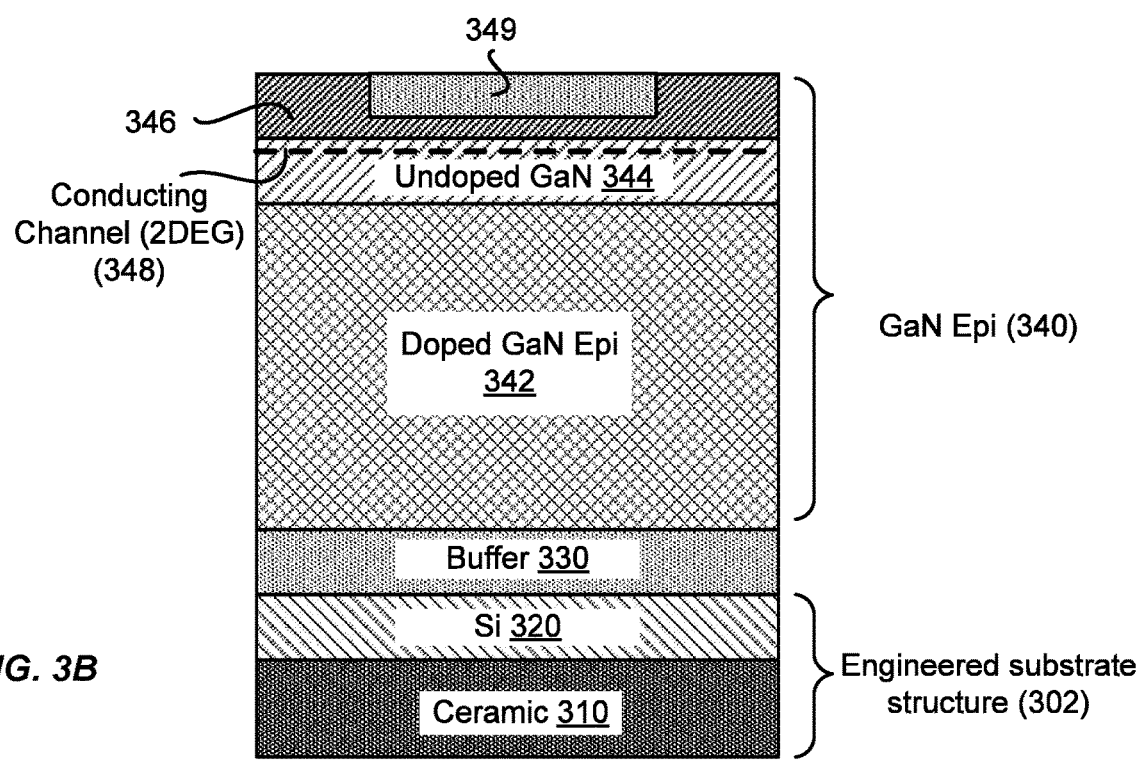

FIGS. 3A and 3B are simplified schematic cross-sectional diagrams illustrating intermediate steps in a method of forming doped regions in GaN materials by diffusion according to some other embodiments of the present invention.

Referring to FIG. 3A, an engineered substrate structure 302 is provided. The engineered substrate structure 302 may include a ceramic substrate 310 with a thin silicon (Si) layer 320 formed thereon. In some embodiments, the engineered substrate structure 302 may be similar to the engineered substrate structure illustrated in FIG. 8, as discussed herein. In other embodiments, other types of substrates may be used. The silicon layer 320 may provide a surface for subsequent epitaxial growth. The ceramic substrate 310 may have a CTE that is substantially matched to the CTE of one or more subsequent epitaxial layers.

A buffer layer 330 may be epitaxially formed on the Si layer 320. The buffer layer 330 may include one or more layers. In some embodiments, the buffer layer 330 may be relatively thin, for example less than 0.5 micron in thickness. The buffer layer 330 may include, for example, AlN about 0.2 μm in thickness, $Al_{0.25}Ga_{0.75}N$ about 0.125 μm in thickness, combinations thereof, or the like. A relatively thin aluminum-containing buffer layer (e.g., 0.2 μm AlN/0.125 μm $Al_{0.25}Ga_{0.75}N$) can support more than 8 microns of GaN epitaxy on a large diameter substrate, which cannot be fabricated using silicon substrates.

An epitaxial GaN layer 340 may be formed on the buffer layer 330. In some embodiments, the epitaxial GaN layer 340 may have a thickness that is greater than 8 μm for high voltage resistance. For example, a breakdown voltage greater than 500 V or 600 V may be achieved in the power devices subsequently formed on the epitaxial GaN layer 340. As illustrated in FIG. 3A, the epitaxial GaN layer 340 may include a doped epitaxial GaN layer 342, an undoped epitaxial GaN layer 344, and an epitaxial AlGaN or InAlN layer 346. The AlGaN/GaN interface may result in a two-dimensional electron gas (2DEG) due to polarization induced charge at the hetero-interface. The 2DEG may form a conduction channel 348 of a high-electron-mobility transistor (HEMT) power device. In some embodiments, the doped epitaxial GaN layer 342 may have a thickness of 5 μm or greater. The doped epitaxial GaN layer 342 may include C- or Fe-doped GaN in some embodiments to provide for high resistance.

Referring to FIG. 3A, a mask 350 may be formed on the epitaxial AlGaN or InAlN layer 346. The mask 350 may have a pattern that includes one or a plurality of windows 352 exposing a plurality of portions of a top surface of the epitaxial AlGaN or InAlN layer 346. The mask 350 may include a photoresist, for example.

The structure may then be put in a thin film growth chamber, for example an MOCVD chamber. Referring again to FIG. 3A, a magnesium-containing GaN layer 360 may be deposited on the plurality of exposed portions of the top surface of the epitaxial AlGaN or InAlN layer 346 at a deposition temperature in a process similar to an MOCVD process. The deposition temperature may be in a range from about 900° C. to about 1100° C. In some embodiments, the magnesium density in the magnesium-containing gallium nitride layer 360 may be approximately from $1\times10^{19}$ cm$^{-3}$ to $1\times10^{20}$ cm$^{-3}$. At such high temperatures and high magnesium density, magnesium may diffuse into the epitaxial AlGaN or InAlN layer 346 through the windows 352 of the mask 350 to form a plurality P-doped regions 349 in the epitaxial AlGaN or InAlN layer 346, as illustrated in FIG. 3B. Here, the magnesium-containing GaN layer 360 may serve as a solid source of magnesium dopants, and may not be a high quality epitaxial layer. The magnesium-containing GaN layer 360 may also protect the underlying epitaxial AlGaN or InAlN layer 346 from decomposition during the diffusion process.

After formation of the p-doped regions 349 via diffusion has been achieved, the magnesium-containing GaN layer 360 and the mask 350 may be removed, as illustrated in FIG. 3B. In some embodiments, the magnesium dopants may diffuse to the interface between the epitaxial AlGaN or InAlN layer 346 and the undoped epitaxial GaN layer 344, resulting in a P-type doped region 349 that is as thick as the epitaxial AlGaN or InAlN layer 346. As a HEMT power device, the magnesium dopants in the P-type doped region 349 serves to adjust the density of the 2DEG 348 and hence the threshold voltage of the HEMT.

Figure 4A:
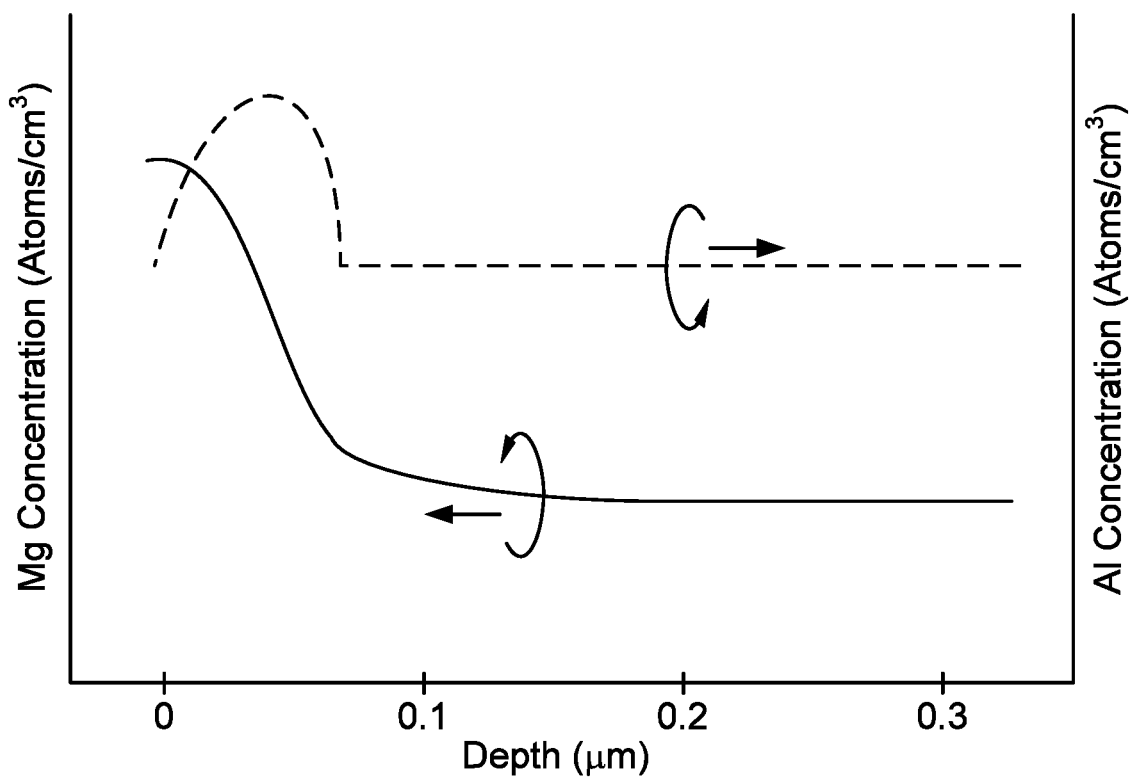
FIGS. 4A and 4B show exemplary plots of magnesium and aluminum concentrations as a function of depth obtained from secondary ion mass spectroscopy (SIMS) according to some embodiments of the present invention.
Figure 4B:
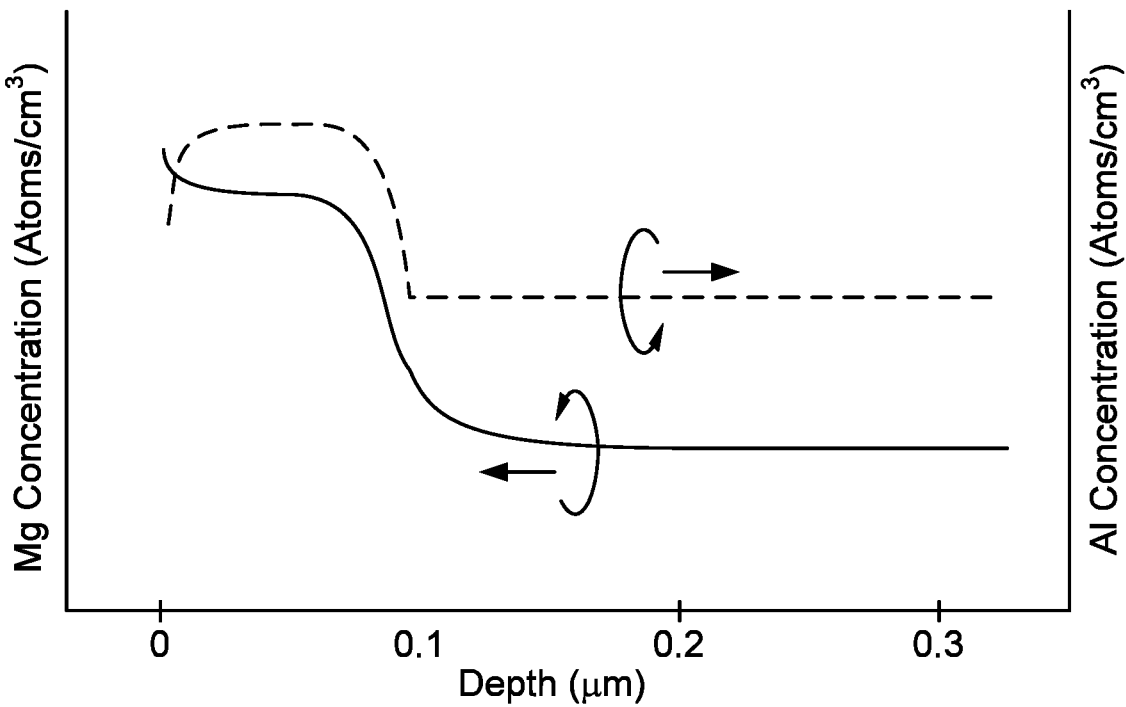

FIGS. 4A and 4B show exemplary plots of magnesium and aluminum concentrations as a function of depth obtained from secondary ion mass spectroscopy (SIMS) according to some embodiments of the present invention. FIG. 4A represents SIMS data for magnesium and aluminum concentrations collected after diffusion of magnesium into an epitaxial AlGaN layer that was about 10 nm thick. FIG. 4B represents SIMS data for magnesium and aluminum concentration collected after diffusion of magnesium into an epitaxial AlGaN layer that was about 20 nm thick. As illustrated, there is significant magnesium diffusion into the epitaxial AlGaN layer, demonstrating the formation of p-doped region 349 as illustrated in FIG. 3B. The depth of the diffusion and the ability to control the diffusion depth and concentration as a function of depth is illustrated by this data.

Figure 5A:
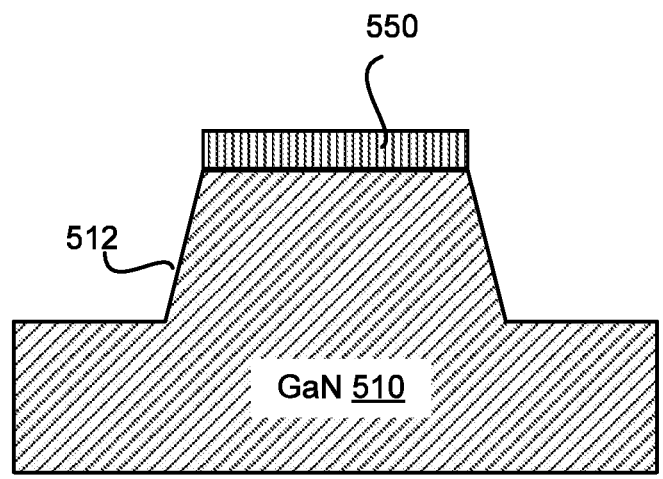
FIGS. 5A-5C are simplified schematic cross-sectional diagrams illustrating intermediate steps in a method of forming doped regions in GaN materials by diffusion according to some further embodiments of the present invention.
Figure 5B:
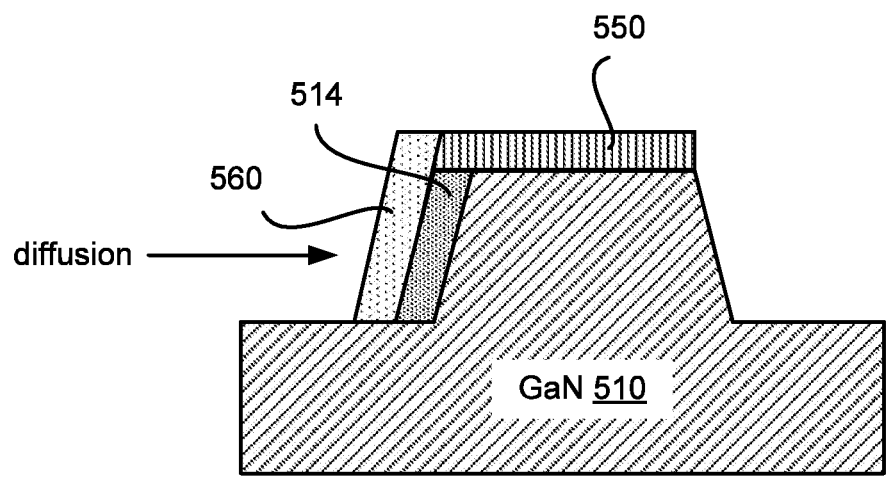
Figure 5C:
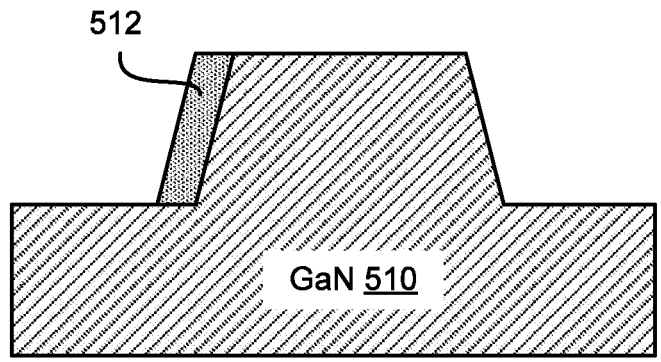

FIGS. 5A-5C are simplified schematic cross-sectional diagrams illustrating intermediate steps in a method of forming doped regions in GaN materials by diffusion according to some further embodiments of the present invention.

Referring to FIG. 5A, an undoped epitaxial GaN layer 510 may be formed on a substrate structure (not shown). A portion of the undoped epitaxial GaN layer 510 may have a mesa shape with side walls 512. A mask 550 may be formed on a top surface of the epitaxial GaN layer 510, while the side walls 512 are exposed.

The structure may then be placed in a thin film growth chamber, for example an MOCVD chamber. Referring to FIG. 5B, a magnesium-containing GaN layer 560 may be deposited on the side walls 512 at a deposition temperature in a process similar to an MOCVD process. The deposition temperature may be in a range from about 900° C. to about 1100° C. In some embodiments, the magnesium density in the magnesium-containing gallium nitride layer 560 may be approximately from $1\times10^{19}$ cm$^{-3}$ to $1\times10^{20}$ cm$^{-3}$. At such high temperatures and high magnesium density, concurrent with the deposition process, magnesium may diffuse sideways (e.g., in the direction of the arrow) into the undoped epitaxial GaN layer 510 through the side wall 512 to form a P-type doped region 514. After diffusion has been achieved, the magnesium-containing GaN layer 560 and the mask 550 may be removed, as illustrated in FIG. 5C.

According to some embodiments, side-wall magnesium diffusion in GaN materials can be used to fabricate a variety of vertical-channel devices, such as vertical junction gate field-effect transistor (JFET), vertical merged p-i-n or merged Schottky diodes, and the like.

According to some other embodiments, magnesium diffusion in GaN materials may be used to fabricate metal-oxide-semiconductor field-effect transistors (MOSFETs). For example, for a pMOS device, magnesium diffusion can be used to implement or adjust the profiles of the source and drain, and/or to modify the channel doping profile. For an nMOS device, magnesium diffusion can be used to implement or adjust the channel doping profile.

Figure 6A:
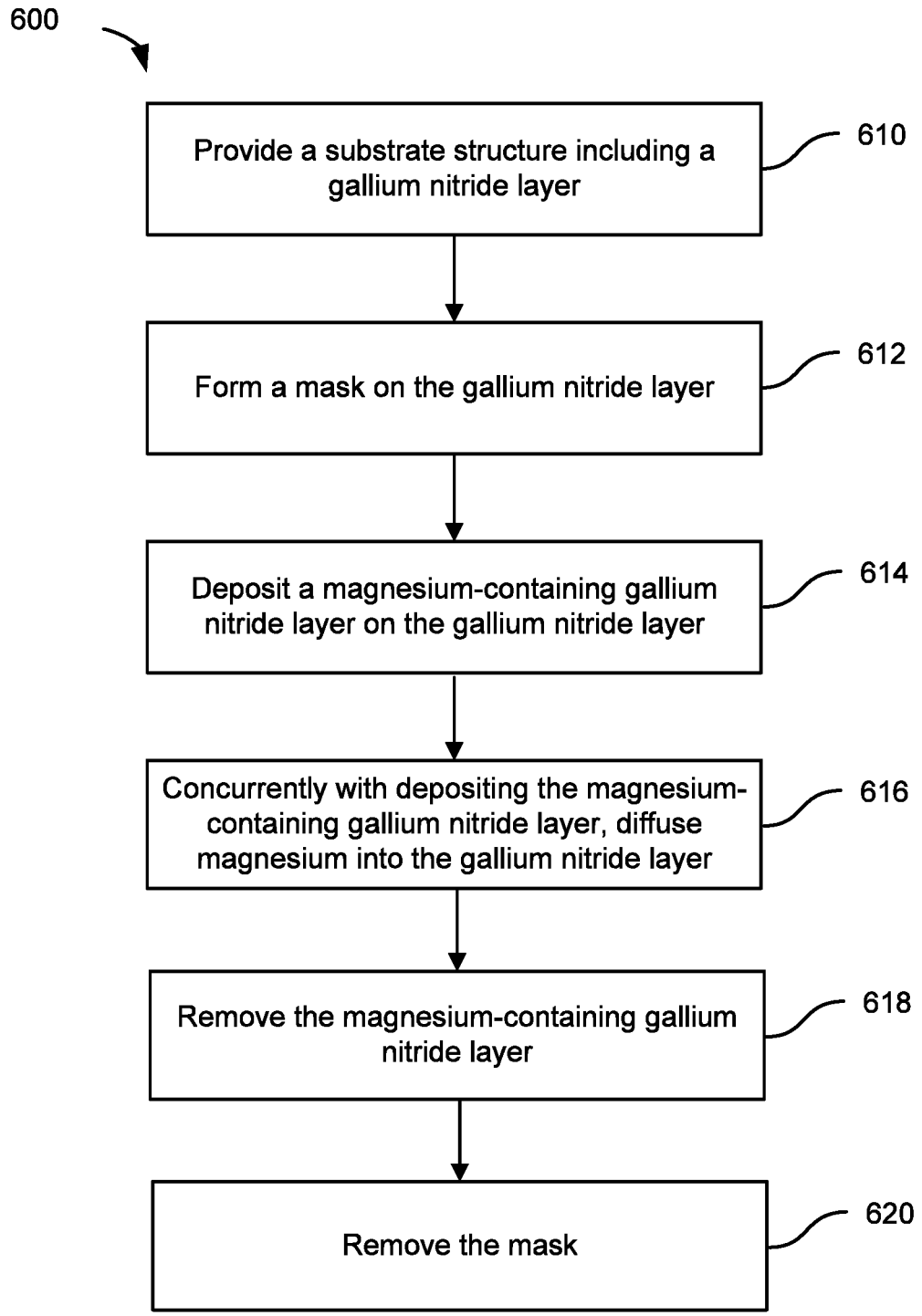
FIG. 6A is a simplified flowchart illustrating a method of forming doped regions by diffusion in gallium nitride materials according to some embodiments of the present invention.

FIG. 6A is a simplified flowchart illustrating a method 600 of forming doped regions by diffusion in gallium nitride materials according to some embodiments of the present invention. The method includes providing a substrate structure including a gallium nitride layer (610) and forming a mask on the gallium nitride layer (612). The mask exposes one or more portions of a top surface of the gallium nitride layer.

In an embodiment, the substrate structure includes a buffer layer formed on a substrate, a first epitaxial gallium nitride layer formed on the buffer layer, and a second epitaxial gallium nitride layer formed on the first epitaxial gallium nitride layer. The one or more magnesium-doped regions are formed in the second epitaxial gallium nitride layer. In another embodiment, the substrate includes a polycrystalline ceramic core, a barrier layer encapsulating the polycrystalline ceramic core, a bonding layer coupled to the barrier layer, and a substantially single crystalline layer coupled to the bonding layer. The second epitaxial gallium nitride layer can be undoped before the magnesium-containing gallium nitride layer is deposited. The first epitaxial gallium nitride layer can be N-type doped. Each of the one or more magnesium-doped regions in the second epitaxial gallium nitride layer can form a p-n junction at an interface with the first epitaxial gallium nitride layer. Moreover, the one or more magnesium-doped regions in the second epitaxial gallium nitride layer can form parts of a merged p-i-n diode. Additionally, the one or more magnesium-doped regions in the second epitaxial gallium nitride layer can form parts of a merged Schottky diode.

In a particular embodiment, two of the one or more magnesium-doped regions in the second epitaxial gallium nitride layer include a first edge termination region and a second edge termination region separated from each other by a portion of the second epitaxial gallium nitride layer. In this particular embodiment, the method further includes forming a Schottky contact coupled to the portion of the second epitaxial gallium nitride layer, and to the first edge termination region and the second edge termination region.

The method also includes depositing a magnesium-containing gallium nitride layer on the one or more portions of the top surface of the gallium nitride layer (614) and concurrently with depositing the magnesium-containing gallium nitride layer, forming one or more magnesium-doped regions in the gallium nitride layer by diffusing magnesium into the gallium nitride layer through the one or more portions (616). The magnesium-containing gallium nitride layer provides a source of magnesium dopants for the diffusion process. As an example, the magnesium-containing gallium nitride layer can have a magnesium density ranging from about $1 \times 10^{19}$ cm$^{-3}$ to about $1 \times 10^{20}$ cm$^{-3}$. Depositing the magnesium-containing gallium nitride layer can be performed in a thin film deposition chamber and can be performed at a temperature ranging from about 900° C. to about 1100° C. The method further includes removing the magnesium-containing gallium nitride layer (618) and removing the mask (620).

Although a magnesium-containing gallium nitride layer is illustrated in FIG. 6A, embodiments of the present invention are not limited to the use of a magnesium-containing gallium nitride layer and other layers containing magnesium can be utilized in accordance with the present invention. As examples, one or more layers of magnesium-containing material can be utilized in place of or in combination with a magnesium-containing gallium nitride layer, including a layer of magnesium, a layer of magnesium oxide, a layer of magnesium nitride, a layer of magnesium fluoride, combinations thereof, or the like. Thus, a variety of magnesium sources are included within the scope of the present invention.

It should be appreciated that the specific steps illustrated in FIG. 6A provide a particular method of forming doped regions by diffusion in gallium nitride materials according to some embodiments of the present invention. Other sequences of steps may also be performed according to alternative embodiments. For example, alternative embodiments of the present invention may perform the steps outlined above in a different order. Moreover, the individual steps illustrated in FIG. 6A may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 6B:
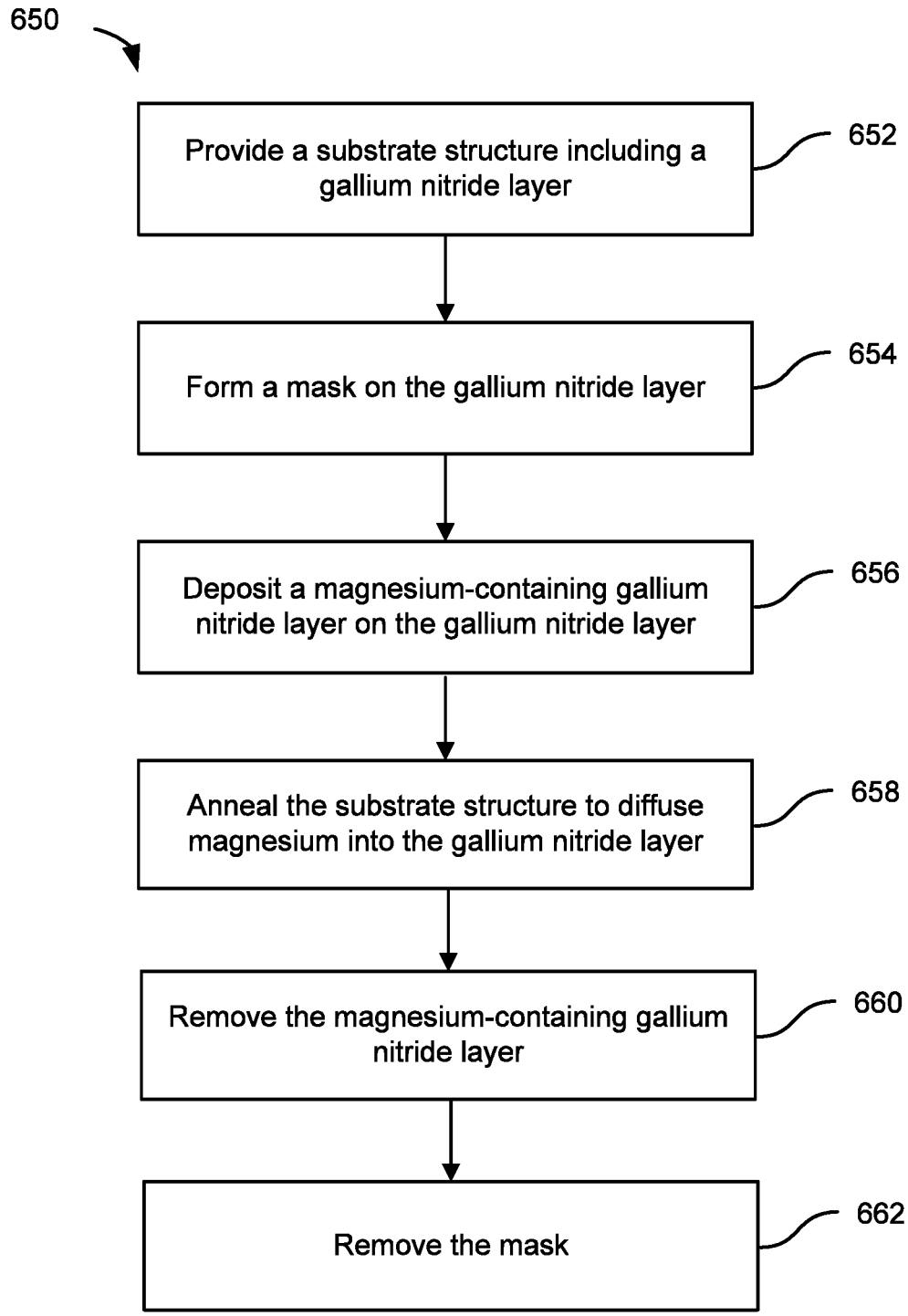
FIG. 6B is a simplified flowchart illustrating a method of forming doped regions by diffusion in gallium nitride materials according to another embodiment of the present invention.

FIG. 6B is a simplified flowchart illustrating a method of forming doped regions by diffusion in gallium nitride materials according to another embodiment of the present invention. In the embodiment illustrated in FIG. 6B, an annealing process is utilized to diffuse magnesium into the substrate structure to form the one or more magnesium-doped regions. Referring to FIG. 6B, the method 650 includes providing a substrate structure including a gallium nitride layer (652) and forming a mask on the gallium nitride layer (654). The mask exposes one or more portions of a top surface of the gallium nitride layer.

In an embodiment, the substrate structure includes a buffer layer formed on a substrate, a first epitaxial gallium nitride layer formed on the buffer layer, and a second epitaxial gallium nitride layer formed on the first epitaxial gallium nitride layer. The one or more magnesium-doped regions are formed in the second epitaxial gallium nitride layer. In another embodiment, the substrate includes a polycrystalline ceramic core, a barrier layer encapsulating the polycrystalline ceramic core, a bonding layer coupled to the barrier layer, and a substantially single crystalline layer coupled to the bonding layer. The second epitaxial gallium nitride layer can be undoped before the magnesium-containing gallium nitride layer is deposited. The first epitaxial gallium nitride layer can be N-type doped. Each of the one or more magnesium-doped regions in the second epitaxial gallium nitride layer can form a p-n junction at an interface with the first epitaxial gallium nitride layer. Moreover, the one or more magnesium-doped regions in the second epitaxial gallium nitride layer can form parts of a merged p-i-n diode. Additionally, the one or more magnesium-doped regions in the second epitaxial gallium nitride layer can form parts of a merged Schottky diode.

In a particular embodiment, two of the one or more magnesium-doped regions in the second epitaxial gallium nitride layer include a first edge termination region and a second edge termination region separated from each other by a portion of the second epitaxial gallium nitride layer. In this particular embodiment, the method further includes forming a Schottky contact coupled to the portion of the second epitaxial gallium nitride layer, and to the first edge termination region and the second edge termination region.

The method also includes depositing a magnesium-containing gallium nitride layer on the one or more portions of the top surface of the gallium nitride layer (656) and annealing the substrate structure to form one or more magnesium-doped regions in the gallium nitride layer by diffusing magnesium into the gallium nitride layer through the one or more portions during the annealing process (658). The magnesium-containing gallium nitride layer provides a source of magnesium dopants for the diffusion process that occurs during the annealing process. As an example, the magnesium-containing gallium nitride layer can have a magnesium density ranging from about $1 \times 10^{19}$ cm$^{-3}$ to about $1 \times 10^{20}$ cm$^{-3}$. Depositing the magnesium-containing gallium nitride layer can be performed in a thin film deposition chamber and can be performed at a temperature ranging from about 900° C. to about 1100° C. The method further includes removing the magnesium-containing gallium nitride layer (660) and removing the mask (662).

Although a magnesium-containing gallium nitride layer is illustrated in FIG. 6B, embodiments of the present invention are not limited to the use of a magnesium-containing gallium nitride layer and other layers containing magnesium can be utilized in accordance with the present invention. As examples, one or more layers of magnesium-containing material can be utilized in place of or in combination with a magnesium-containing gallium nitride layer, including a layer of magnesium, a layer of magnesium oxide, a layer of magnesium nitride, a layer of magnesium fluoride, combinations thereof, or the like. Thus, a variety of magnesium sources are included within the scope of the present invention.

The annealing of the substrate structure can utilize a variety of anneal times and temperatures and the desired doping profile suitable for a particular device structure. Multi-step anneals can be utilized in some embodiments to achieve the desired doping profile. As an example, one or more rapid thermal anneal (RTA) processes can be utilized after the deposition process (656). The RTA process can utilize temperatures in a range from 800° C. to 1400° C. and times ranging from several seconds to several hours, for example, 1 minute at 1400° C., 4 hours at 800° C., or the like. The ambient gas during the anneal process can include the use of nitrogen and/or ammonia to provide an overpressure during the anneal process, the use of inert gases, or the like. As will be evident to one of skill in the art, the ambient gas pressure will depend on the anneal temperatures and times. One of ordinary skill in the art would recognize many variations, modifications, and alternatives.

It should be appreciated that the specific steps illustrated in FIG. 6B provide a particular method of forming doped regions by diffusion in gallium nitride materials according to another embodiments of the present invention. Other sequences of steps may also be performed according to alternative embodiments. For example, alternative embodiments of the present invention may perform the steps outlined above in a different order. Moreover, the individual steps illustrated in FIG. 6B may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 7A:
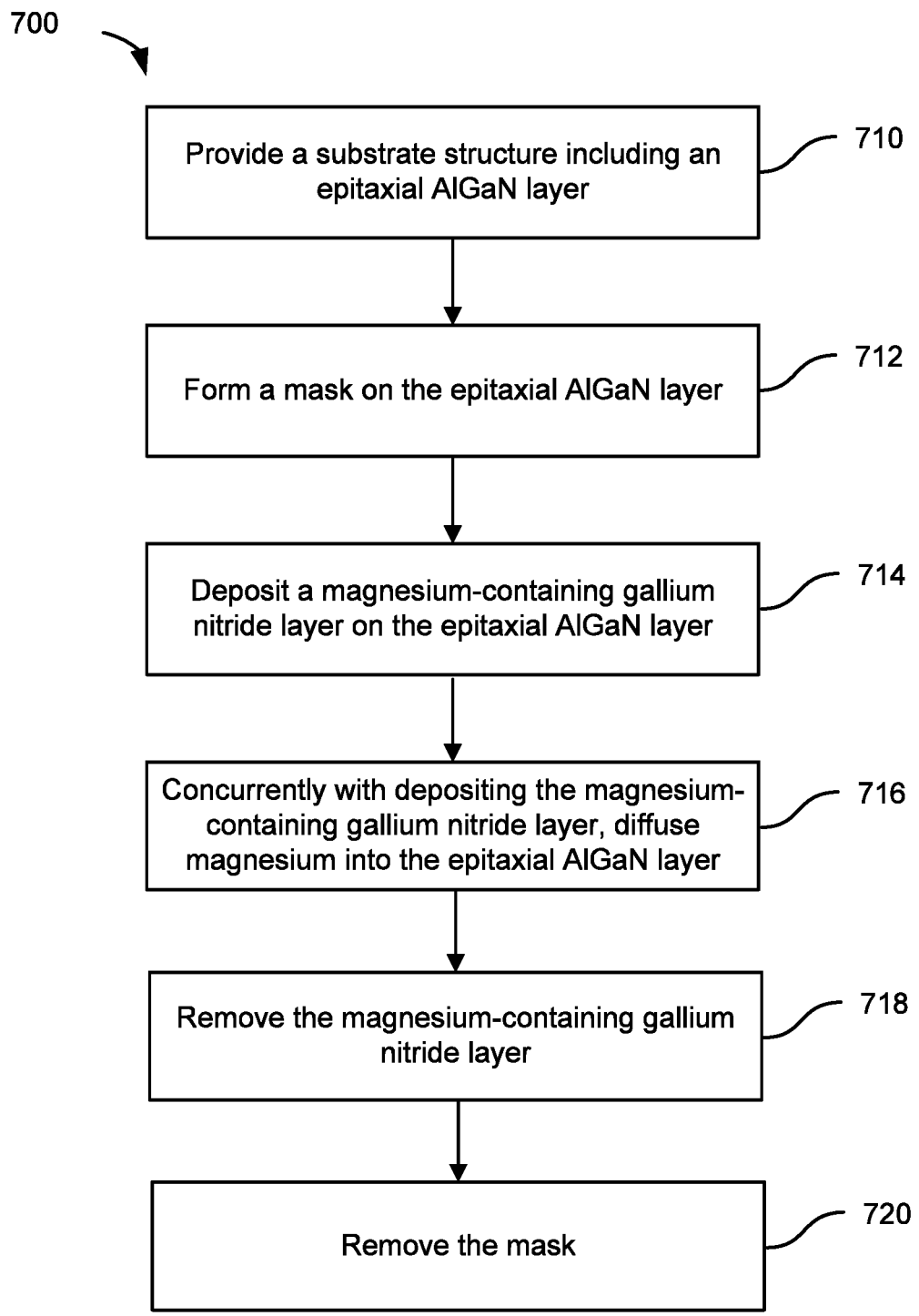
FIG. 7A is a simplified flowchart illustrating a method of forming doped regions by diffusion in gallium nitride materials according to some other embodiments of the present invention.

FIG. 7A is a simplified flowchart illustrating a method 700 of forming doped regions by diffusion in gallium nitride materials according to some other embodiments of the present invention. The method includes providing a gallium nitride substrate structure (710). The gallium nitride substrate structure includes a buffer layer formed on a substrate, a first epitaxial gallium nitride layer formed on the buffer layer, a second epitaxial gallium nitride layer formed on the first epitaxial gallium nitride layer, and an epitaxial aluminum gallium nitride layer formed on the second epitaxial gallium nitride layer.

The method also includes forming a mask on the epitaxial aluminum gallium nitride layer (712). The mask exposes one or more portions of a top surface of the epitaxial aluminum gallium nitride layer. The method further includes depositing a magnesium-containing gallium nitride layer on the one or more portions of the top surface of the epitaxial aluminum gallium nitride layer (714) and concurrently with depositing the magnesium-containing gallium nitride layer, forming one or more magnesium-doped regions in the epitaxial aluminum gallium nitride layer by diffusing magnesium into the epitaxial aluminum gallium nitride layer through the one or more portions (716). The magnesium-containing gallium nitride layer provides a source of magnesium dopants for the diffusion process and can have a magnesium density ranging from about $1\times10^{19}$ cm$^{-3}$ to about $1\times10^{19}$ cm$^{-3}$. Depositing the magnesium-containing gallium nitride layer can be performed in a thin film deposition chamber, for example, at a temperature ranging from about 900° C. to about 1100° C. The method further includes removing the magnesium-containing gallium nitride layer (718) and removing the mask (720).

Although a magnesium-containing gallium nitride layer is illustrated in FIG. 7A, embodiments of the present invention are not limited to the use of a magnesium-containing gallium nitride layer and other layers containing magnesium can be utilized in accordance with the present invention. As examples, one or more layers of magnesium-containing material can be utilized in place of or in combination with a magnesium-containing gallium nitride layer, including a layer of magnesium, a layer of magnesium oxide, a layer of magnesium nitride, a layer of magnesium fluoride, combinations thereof, or the like. Thus, a variety of magnesium sources are included within the scope of the present invention.

In an embodiment, the substrate includes a polycrystalline ceramic core, a barrier layer encapsulating the polycrystalline ceramic core, a bonding layer coupled to the barrier layer, and a substantially single crystalline layer coupled to the bonding layer. The second epitaxial gallium nitride layer can be undoped. The first epitaxial gallium nitride layer can be N-type doped. Each of the one or more magnesium-doped regions in the epitaxial aluminum gallium nitride layer can form an interface with the second epitaxial gallium nitride layer, in which case, the interface controls a threshold voltage of a high-electron-mobility transistor (HEMT) power device.

It should be appreciated that the specific steps illustrated in FIG. 7A provide a particular method of forming doped regions by diffusion in gallium nitride materials according to some embodiments of the present invention. Other sequences of steps may also be performed according to alternative embodiments. For example, alternative embodiments of the present invention may perform the steps outlined above in a different order. Moreover, the individual steps illustrated in FIG. 7A may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 7B:
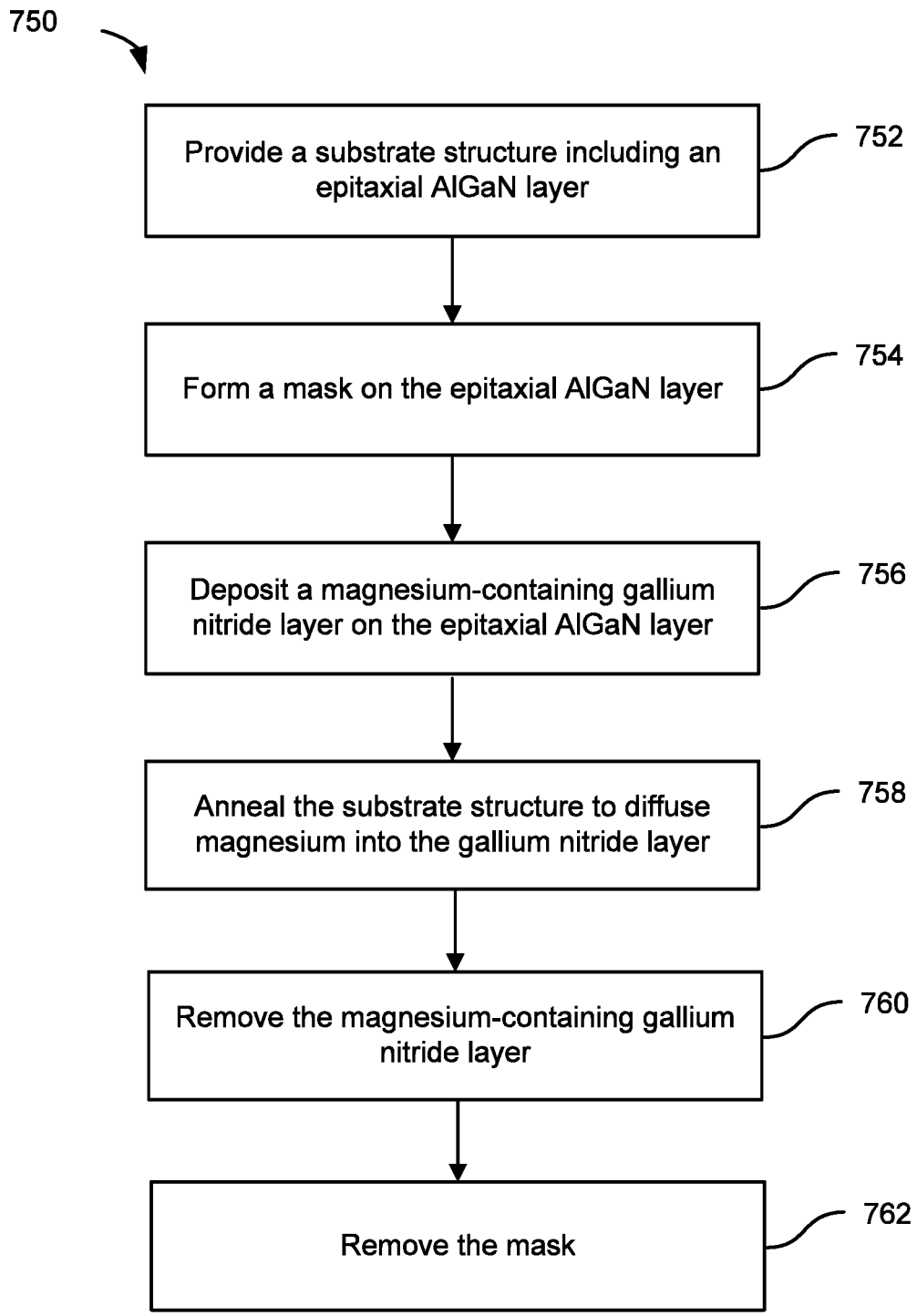
FIG. 7B is a simplified flowchart illustrating a method of forming doped regions by diffusion in gallium nitride materials according to alternative embodiments of the present invention.

FIG. 7B is a simplified flowchart illustrating a method of forming doped regions by diffusion in gallium nitride materials according to alternative embodiments of the present invention. Referring to FIG. 7B, the method 750 includes providing a gallium nitride substrate structure (752). The gallium nitride substrate structure includes a buffer layer formed on a substrate, a first epitaxial gallium nitride layer formed on the buffer layer, a second epitaxial gallium nitride layer formed on the first epitaxial gallium nitride layer, and an epitaxial aluminum gallium nitride layer formed on the second epitaxial gallium nitride layer.

The method also includes forming a mask on the epitaxial aluminum gallium nitride layer (754). The mask exposes one or more portions of a top surface of the epitaxial aluminum gallium nitride layer. The method further includes depositing a magnesium-containing gallium nitride layer on the one or more portions of the top surface of the epitaxial aluminum gallium nitride layer (756) and annealing the substrate structure to form one or more magnesium-doped regions in the epitaxial aluminum gallium nitride layer by diffusing magnesium into the epitaxial aluminum gallium nitride layer through the one or more portions during the annealing process (758). The magnesium-containing gallium nitride layer provides a source of magnesium dopants for the diffusion process and can have a magnesium density ranging from about $1\times10^{19}$ cm$^{-3}$ to about $1\times10^{19}$ cm$^{-3}$. Depositing the magnesium-containing gallium nitride layer can be performed in a thin film deposition chamber, for example, at a temperature ranging from about 900° C. to about 1100° C. The method further includes removing the magnesium-containing gallium nitride layer (760) and removing the mask (762).

Although a magnesium-containing gallium nitride layer is illustrated in FIG. 7B, embodiments of the present invention are not limited to the use of a magnesium-containing gallium nitride layer and other layers containing magnesium can be utilized in accordance with the present invention. As examples, one or more layers of magnesium-containing material can be utilized in place of or in combination with a magnesium-containing gallium nitride layer, including a layer of magnesium, a layer of magnesium oxide, a layer of magnesium nitride, a layer of magnesium fluoride, combinations thereof, or the like. Thus, a variety of magnesium sources are included within the scope of the present invention.

In an embodiment, the substrate includes a polycrystalline ceramic core, a barrier layer encapsulating the polycrystalline ceramic core, a bonding layer coupled to the barrier layer, and a substantially single crystalline layer coupled to the bonding layer. The second epitaxial gallium nitride layer can be undoped. The first epitaxial gallium nitride layer can be N-type doped. Each of the one or more magnesium-doped regions in the epitaxial aluminum gallium nitride layer can form an interface with the second epitaxial gallium nitride layer, in which case, the interface controls a threshold voltage of a high-electron-mobility transistor (HEMT) power device.

It should be appreciated that the specific steps illustrated in FIG. 7B provide a particular method of forming doped regions by diffusion in gallium nitride materials according to alternative embodiments of the present invention. Other sequences of steps may also be performed according to alternative embodiments. For example, alternative embodiments of the present invention may perform the steps outlined above in a different order. Moreover, the individual steps illustrated in FIG. 7B may include multiple sub-steps that may be performed in various sequences as appropriate to the individual step. Furthermore, additional steps may be added or removed depending on the particular applications. One of ordinary skill in the art would recognize many variations, modifications, and alternatives.

FIG. 8 is a simplified schematic diagram illustrating an engineered substrate structure according to some embodiments of the present invention. As illustrated in FIG. 8, the engineered substrate structure may be suitable for a variety of electronic and optical applications. The engineered substrate structure includes a core 810 (e.g., AlN Substrate) that can have a coefficient of thermal expansion (CTE) that is substantially matched to the CTE of the epitaxial material that will be grown on the engineered substrate structure, for example, on the exfoliated silicon (111) layer 825.

For applications including the growth of gallium nitride (GaN)-based materials (epitaxial layers including GaN-based layers), the core 810 can be a polycrystalline ceramic material, for example, polycrystalline aluminum nitride (AlN), which can include a binding material such as yttrium oxide. Other materials can be utilized in the core, including polycrystalline gallium nitride (GaN), polycrystalline aluminum gallium nitride (AlGaN), polycrystalline silicon carbide (SiC), polycrystalline zinc oxide (ZnO), polycrystalline gallium trioxide ($Ga_2O_3$), and the like.

The thickness of the core 810 can be on the order of 100 to 1,500 µm, for example, 750 µm. The core 810 is encapsulated in an adhesion layer 812 that can be referred to as a shell or an encapsulating shell. In an embodiment, the adhesion layer 812 comprises a tetraethyl orthosilicate (TEOS) oxide layer on the order of 1,000 Å in thickness. In other embodiments, the thickness of the adhesion layer 812 varies, for example, from 100 Å to 2,000 Å. Although TEOS oxides are utilized for adhesion layers 812 in some embodiments, other materials that provide for adhesion between later deposited layers and underlying layers or materials (e.g., ceramics, in particular, polycrystalline ceramics) can be utilized according to an embodiment of the present invention. For example, $SiO_2$ or other silicon oxides ($Si_xO_y$) adhere well to ceramic materials and provide a suitable surface for subsequent deposition, for example, of conductive materials. The adhesion layer 812 completely surrounds the core 810 in some embodiments to form a fully encapsulated core 810 and can be formed using an LPCVD process or other suitable deposition processes, which can be compatible with semiconductor processing and in particular with polycrystalline or composite substrates and layers. The adhesion layer 812 provides a surface on which subsequent layers adhere to form elements of the engineered substrate structure.

In addition to the use of LPCVD processes, spin on glass/dielectrics, furnace-based processes, and the like to form the encapsulating adhesion layer, other semiconductor processes can be utilized according to embodiments of the present invention, including CVD processes or similar deposition processes. As an example, a deposition process that coats a portion of the core 810 can be utilized, the core 810 can be flipped over, and the deposition process could be repeated to coat additional portions of the core 810. Thus, although LPCVD techniques are utilized in some embodiments to provide a fully encapsulated structure, other film formation techniques can be utilized depending on the particular application.

A conductive layer 814 is formed surrounding the adhesion layer 812. In an embodiment, the conductive layer 814 is a shell of polysilicon (i.e., polycrystalline silicon) that is formed surrounding the adhesion layer 812 since polysilicon can exhibit poor adhesion to ceramic materials. In embodiments in which the conductive layer 814 is polysilicon, the thickness of the polysilicon layer can be on the order of 500-5,000 Å, for example, 2,500 Å. In some embodiments, the polysilicon layer can be formed as a shell to completely surround the adhesion layer 812 (e.g., a TEOS oxide layer), thereby forming a fully encapsulated adhesion layer 812, and can be formed using an LPCVD process. In other embodiments, as discussed below, the conductive material can be formed on a portion of the adhesion layer 812, for example, a lower half of the substrate structure. In some embodiments, conductive material can be formed as a fully encapsulating layer and subsequently removed on one side of the substrate structure.

In an embodiment, the conductive layer 814 can be a polysilicon layer doped to provide a highly conductive material, for example, doped with boron to provide a p-type polysilicon layer. In some embodiments, the doping with boron is at a level of $1\times10^{19}$ $cm^{-3}$ to $1\times10^{20}$ $cm^{-3}$ to provide for high conductivity. Other dopants at different dopant concentrations (e.g., phosphorus, arsenic, bismuth, or the like at dopant concentrations ranging from $1\times10^{16}$ $cm^{-3}$ to $5\times10^{18}$ $cm^{-3}$) can be utilized to provide either n-type or p-type semiconductor materials suitable for use in the conductive layer 814. One of ordinary skill in the art would recognize many variations, modifications, and alternatives.

The presence of the conductive layer 814 is useful during electrostatic chucking of the engineered substrate to semiconductor processing tools, for example tools with electrostatic chucks (ESC or e-chuck). The conductive layer enables rapid dechucking after processing in the semiconductor processing tools. In embodiments of the present invention, the conductive layer 814 enables electrical contact with the chuck or capacitive coupling to the e-chuck during future processing including bonding. Thus, embodiments of the present invention provide substrate structures that can be processed in manners utilized with conventional silicon wafers. One of ordinary skill in the art would recognize many variations, modifications, and alternatives. Additionally, having a substrate structure with high thermal conductivity in combination with the electrostatic chucking may afford better deposition conditions for the subsequent formation of engineered layers and epitaxial layers, as well as for the subsequent device fabrication steps. For example, it may provide desirable thermal profiles that can result in lower stress, more uniform deposition thicknesses, and better stoichiometry control through the subsequent layer formations.

A second adhesion layer 816 (e.g., a TEOS oxide layer on the order of 1,000 Å in thickness) is formed surrounding the conductive layer 814. The second adhesion layer 816 completely surrounds the conductive layer 814 in some embodiments to form a fully encapsulated structure and can be formed using an LPCVD process, a CVD process, or any other suitable deposition process, including the deposition of a spin-on dielectric.

A barrier layer 818, for example, a silicon nitride layer, is formed surrounding the second adhesion layer 816. In an embodiment, the barrier layer 818 is a silicon nitride layer that is on the order of 2,000 Å to 5,000 Å in thickness. The barrier layer 818 completely surrounds the second adhesion layer 816 in some embodiments to form a fully encapsulated structure and can be formed using an LPCVD process. In addition to silicon nitride layers, amorphous materials including SiCN, SiON, AlN, SiC, and the like can be utilized as barrier layers 818. In some implementations, the barrier layer 818 consists of a number of sub-layers that are built up to form the barrier layer 818. Thus, the term barrier layer is not intended to denote a single layer or a single material, but to encompass one or more materials layered in a composite manner. One of ordinary skill in the art would recognize many variations, modifications, and alternatives.

In some embodiments, the barrier layer 818, e.g., a silicon nitride layer, prevents diffusion and/or outgassing of elements present in the core, for example, yttrium (elemental), yttrium oxide (i.e., yttria), oxygen, metallic impurities, other trace elements, and the like into the environment of the semiconductor processing chambers in which the engineered substrate could be present, for example, during a high temperature (e.g., 1,000° C.) epitaxial growth process. Utilizing the encapsulating layers described herein, ceramic materials, including polycrystalline AlN that are designed for non-clean room environments, can be utilized in semiconductor process flows and clean room environments.

Typically, ceramic materials utilized to form the core are fired at temperatures in the range of 1,800° C. It would be expected that this process would drive out a significant amount of impurities present in the ceramic materials. These impurities can include yttrium, which results from the use of yttria as sintering agent, calcium, and other elements and compounds. Subsequently, during epitaxial growth processes, which are conducted at much lower temperatures in the range of 800° C. to 1,100° C., it would be expected that the subsequent diffusion of these impurities would be insignificant. However, contrary to conventional expectations, the inventors have determined that even during epitaxial growth processes at temperatures much less than the firing temperature of the ceramic materials, significant diffusion of elements through the layers of the engineered substrate was present. Thus, embodiments of the present invention integrate the barrier layer 818 into the engineered substrate structure to prevent this undesirable diffusion.

A bonding layer 820 (e.g., a silicon oxide layer) is deposited on a portion of the barrier layer 818, for example, the top surface of the barrier layer 818, and subsequently used during the bonding of a substantially single crystal layer 825 (e.g., a single crystal silicon layer such as the exfoliated silicon (111) layer illustrated in FIG. 1). The bonding layer 820 can be approximately 1.5 µm in thickness in some embodiments. In some embodiments, the thickness of the bonding layer 820 is 20 nm or more for bond-induced void mitigation. In some embodiments, the thickness of the bonding layer 820 is in the range of 0.75-1.5 µm.

The substantially single crystal layer 825 (e.g., exfoliated Si (111)) is suitable for use as a growth layer during an epitaxial growth process for the formation of epitaxial materials. In some embodiments, the epitaxial material can include a GaN layer 2 µm to 10 µm in thickness, which can be utilized as one of a plurality of layers utilized in optoelectronic, RF, and power devices. In an embodiment, the substantially single crystal layer 825 includes a single crystal silicon layer that is attached to the bonding layer 820 using a layer transfer process.

Additional description related to the engineered substrate structure is provided in U.S. patent application Ser. No. 15/621,335, filed on Jun. 9, 2017, and U.S. patent application Ser. No. 15/621,235, filed on Jun. 9, 2017, the disclosures of which are hereby incorporated by reference in their entirety for all purposes. Although FIG. 8 provides an example of an engineered substrate that can be used during epitaxial growth in some embodiments, it will be appreciated that other substrates can be utilized as discussed in relation to FIG. 1.

Figure 9:
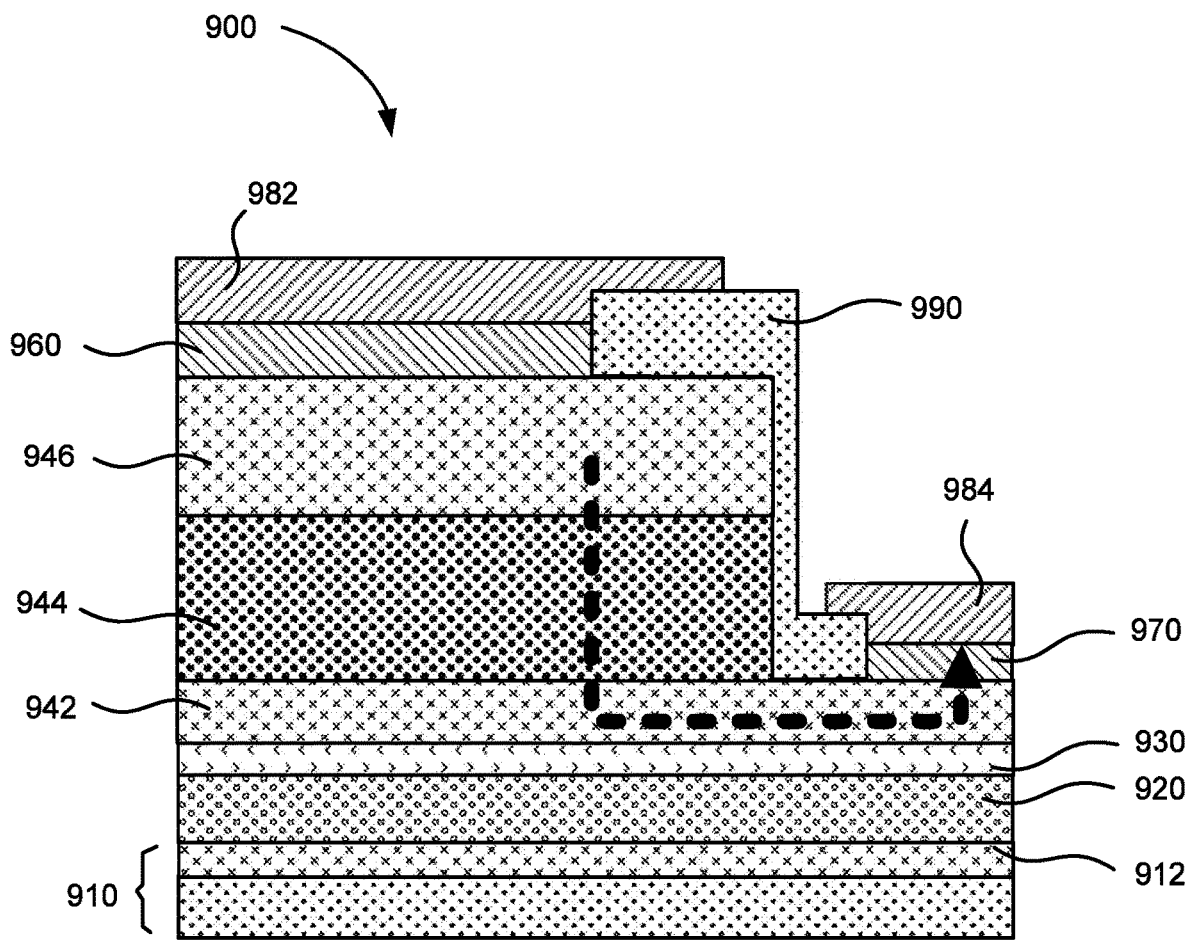
FIG. 9 is a simplified schematic cross-sectional diagram illustrating a vertical p-n diode including a diffusion doped active region formed on an engineered substrate according to an embodiment of the present invention.

FIG. 9 is a simplified schematic cross-sectional diagram illustrating a vertical p-n diode including a diffusion doped active region formed on an engineered substrate according to an embodiment of the present invention. The semiconductor diode 900 includes an engineered substrate 910. In some embodiments, the engineered substrate 910 may include a polycrystalline ceramic core, a first adhesion layer coupled to the polycrystalline ceramic core, a barrier layer coupled to the first adhesion layer, a bonding layer coupled to the barrier layer, and a substantially single crystal layer coupled to the bonding layer. According to an embodiment, the engineered substrate 910 may further include a substantially single crystal layer 912 coupled to the bonding layer. For example, the substantially single crystal layer 912 may comprise substantially single crystalline silicon. In some embodiments, the engineered substrate 910 may further include a nucleation layer (not shown) coupled to the substantially single crystal layer 912 for facilitating the formation of the epitaxial device layers.

In one embodiment, the polycrystalline ceramic core of the substrate 910 comprises aluminum nitride. In some embodiments, the substrate 910 may further includes a conductive layer coupled to the first adhesion layer, and a second adhesion layer coupled to the conductive layer, wherein the conductive layer and the second adhesion layer are disposed between the first adhesion layer and the barrier layer. In some embodiments, the first adhesion layer may comprise a first tetraethyl orthosilicate (TEOS) oxide layer, and the second adhesion layer may comprise a second TEOS oxide layer. The barrier layer may comprise a silicon nitride layer. The conductive layer may comprise a polysilicon layer.

According to an embodiment, the semiconductor diode 900 further includes a buffer layer 920 coupled to the substantially single crystal layer 912. In some embodiments, the buffer layer 920 may be a superlattice that includes a plurality layers. For example, the buffer layer 920 may include an aluminum nitride layer coupled to the single crystal silicon layer, an aluminum gallium nitride layer coupled to the aluminum nitride layer, and a gallium nitride layer coupled to the aluminum gallium nitride layer. The semiconductor diode 900 further includes a semi-insulating layer 930 coupled to the buffer layer 920. In one embodiment, the semi-insulating layer 930 comprises gallium nitride.

According to some embodiments, the semiconductor diode 900 further includes a first N-type gallium nitride layer 942 coupled to the semi-insulating layer 930, a second N-type gallium nitride layer 944 coupled to the first N-type gallium nitride layer 942, and a P-type gallium nitride layer 946 coupled to the second N-type gallium nitride layer 944. The first N-type gallium nitride layer 942 may serve as the N-region of the P-N diode and may have a relatively high N-type doping concentration. The second N-type gallium nitride layer 944 may serve as a drift region and may have a relatively low doping concentration compared to that of the first N-type gallium nitride layer 942. The P-type gallium nitride layer 946 may serve as the P-region of the P-N diode and may have a relatively high P-type doping concentration. As discussed herein, the P-region can be doped with magnesium utilizing the methods described herein.

In one embodiment, a portion of the second N-type gallium nitride layer 944 and a portion of the P-type gallium nitride layer 946 are removed to expose a portion of the first N-type gallium nitride layer 942, so that a cathode contact 970 may be formed thereon. In some embodiments, the cathode contact 970 may comprise a titanium-aluminum (Ti/Al) alloy or other suitable metallic materials. The portion of the second N-type gallium nitride layer 944 and the portion of the P-type gallium nitride layer 946 may be removed by etching or other suitable techniques. An anode contact 960 is formed on the remaining portion of the P-type gallium nitride layer 946. In some embodiments, the anode 960 may comprise a nickel-platinum (Ni/Pt) alloy, a nickel-gold (Ni/Au) alloy, or the like. The semiconductor diode 900 may further include a first field plate 982 coupled to the anode contact 960, and a second field plate 984 coupled to the cathode contact 970. In some embodiments, the semiconductor diode 900 may further include a passivation layer 990 covering the exposed surfaces of the P-type gallium nitride layer 946 and the first N-type gallium nitride layer 942, and the second N-type gallium nitride layer 944. The passivation layer 990 may comprise silicon nitride or other insulating materials.

In some embodiments, the second N-type gallium nitride layer 944 may have a thickness that is greater than about 20 µm. The unique CTE matching properties of the engineered substrate 910 provide the ability to deposit a relatively thick drift region with low dislocation density may afford the semiconductor diode 900 low leakage current and a much higher breakdown voltage, as well as many other advantages.

In other embodiments, the engineered substrate can be partially or completely removed to enable formation of a cathode coupled to the lower surface of the first N-type gallium nitride layer 942 and vertical current flow through device. One of ordinary skill in the art would recognize many variations, modifications, and alternatives.

Figure 10:
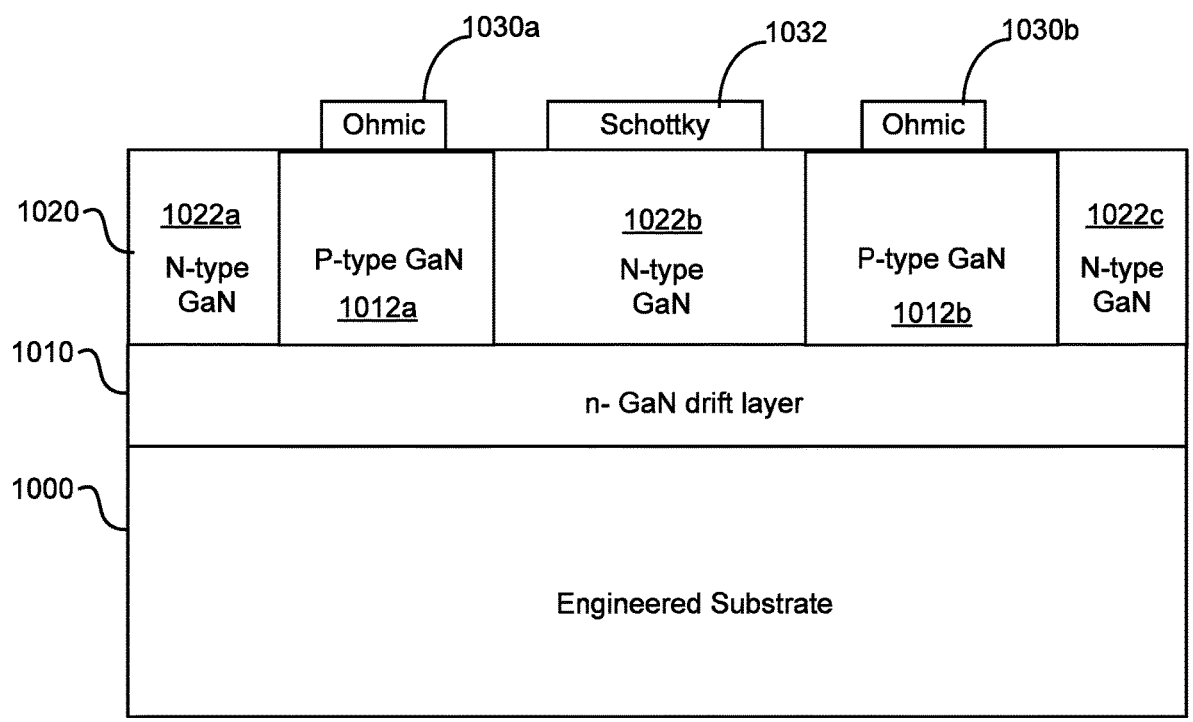
FIG. 10 is a simplified schematic diagram illustrating a merged p-i-n and Schottky (MPS) diode including a diffusion doped active region according to an embodiment of the present invention.

FIG. 10 is a simplified schematic diagram illustrating a merged p-i-n and Schottky (MPS) diode including a diffusion doped active region according to an embodiment of the present invention. The MPS diode may also be referred to as a junction barrier Schottky (JBS) diode. As illustrated in FIG. 10, an engineered substrate 1000 as described herein is utilized to support formation, for example, by epitaxial growth, of n-type GaN drift layer 1010 and n-type GaN layer 1020 that will be used to form the Schottky portion of the MPS diode. A mask (not shown) may be formed on the n-type GaN layer 1020 and patterned as illustrated in FIG. 2A to include one or a plurality of windows exposing a plurality of portions of a top surface of the n-type GaN layer 1020.

The structure may then be placed in a thin film growth chamber, for example an MOCVD chamber and, in a manner similar to the process described in relation to FIG. 2B, a magnesium-containing GaN layer may be formed on the plurality of exposed portions of the top surface of the n-type GaN layer 1020 at a deposition temperature in a process similar to an MOCVD process. As discussed in relation to FIG. 2C, the formation of the magnesium-containing GaN layer will produce magnesium diffusion into the n-type GaN layer through the windows of the mask and formation of a plurality p-type doped regions 1012a and 1012b (i.e., p-type III-N epitaxial regions), which form a p-n junction at the interface with the n-GaN drift layer 1010 as illustrated in FIG. 10. After diffusion has been achieved, the magnesium-containing GaN layer and the mask may be removed in order to form ohmic contacts 1030a and 1030b to p-type III-N epitaxial regions 1012a and 1012b and Schottky contacts 1032 to Schottky diode regions 1022a, 1022b, and 1022c.

Although not illustrated in FIG. 10, an cathode is formed in contact with the n-GaN drift layer, either by formation of a top-side cathode as illustrated in FIG. 9 or by partial or complete removal of the engineered substrate to provide a backside cathode. One of ordinary skill in the art would recognize many variations, modifications, and alternatives.

Figure 11:
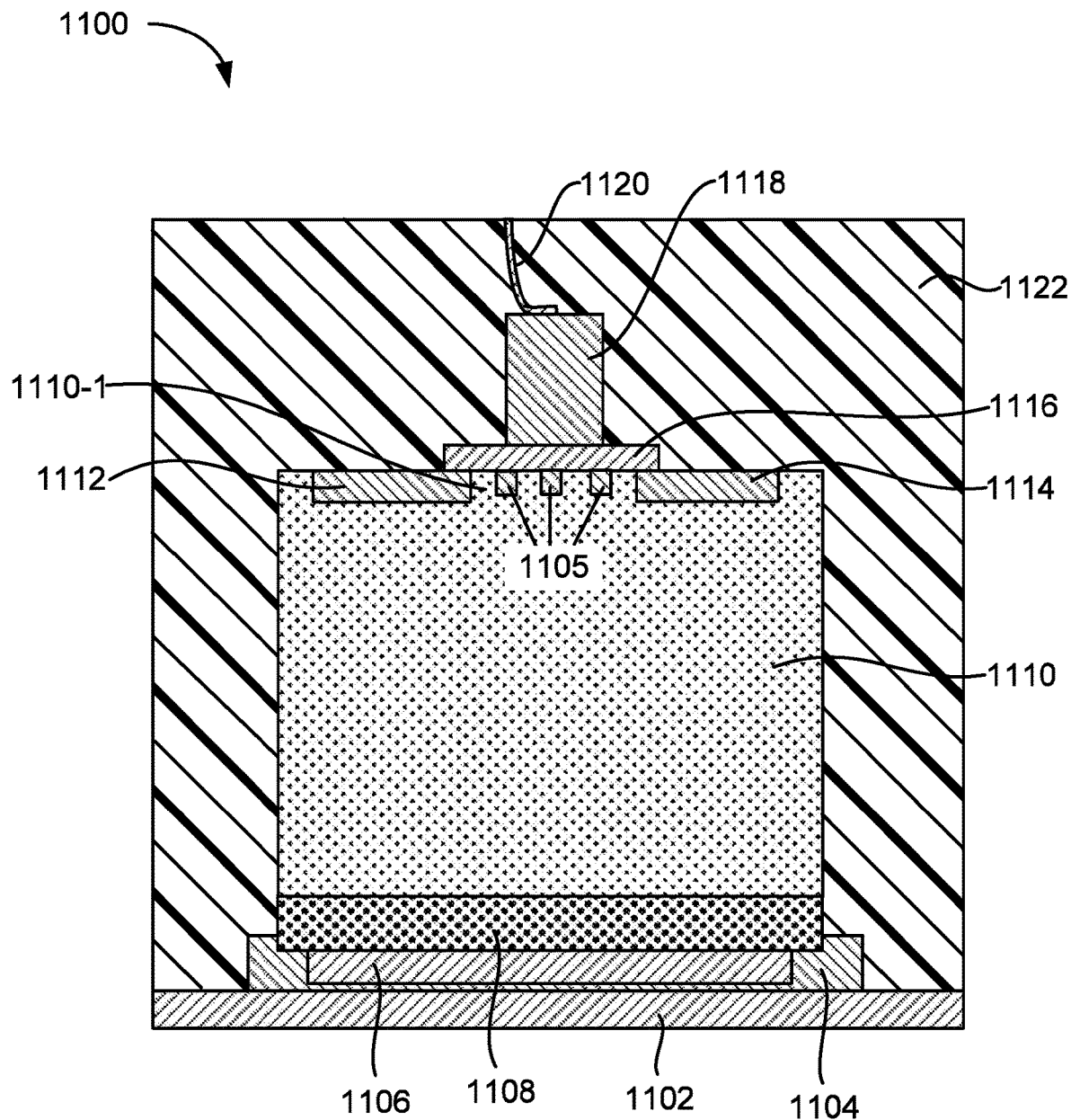
FIG. 11 illustrates schematically a cross-sectional view of a vertical MPS diode with junction termination extensions according to an embodiment of the present invention.

FIG. 11 illustrates schematically a cross-sectional view of a vertical MPS diode with junction termination extensions according to an embodiment of the present invention. According to some embodiments of the present invention, a vertical MPS diode, a p-n diode, a p-i-n diode, or a Schottky diode, illustrated in FIG. 11, may incorporate field control structures at the periphery regions to reduce the magnitude of electric field concentration. Junction termination extensions (JTEs) may extend laterally from a junction to spread a field over a larger area, and thus may increase breakdown voltages and decrease current leakage.

Referring to FIG. 11, the vertical MPS diode 1100 includes an ohmic contact 1106. For example, the ohmic contact 1106 may comprise titanium (Ti), aluminum (Al), nickel (Ni), gold (Au), silver (Ag), or a combination thereof. The vertical MPS diode 1100 may further include a first epitaxial N-type gallium nitride layer 1108 (n$^+$ GaN layer) that physically ontacts the ohmic contact 1106. The first epitaxial N-type gallium nitride layer 1108 may be heavily doped to facilitate the formation of the ohmic contact 1106. For example, the first epitaxial N-type gallium nitride layer 1108 may have a first doping concentration on the order of $1\times10^{18}$ cm$^{-3}$. The vertical MPS diode 1100 may further include a second epitaxial N-type gallium nitride layer (n$^-$ GaN layer) 1110 coupled to the first epitaxial N-type gallium nitride layer 1108. The second epitaxial N-type gallium nitride layer 1110 may be an unintentionally doped GaN layer and may serve as a drift region. The second epitaxial N-type gallium nitride layer 1110 may have a second doping concentration ranging from about $2\times10^{15}$ cm$^{-3}$ to about $1\times10^{16}$ cm$^{-3}$. In some embodiments, the second epitaxial N-type gallium nitride layer 1110 may include an interfacial layer at the interface to the first epitaxial N-type gallium nitride layer 1108. The interfacial layer may include aluminum gallium nitride, indium gallium nitride, and the like.

Although some embodiments have been discussed in terms of a layer, the term layer should be understood such that a layer may include a number of sub-layers that are built up to form the layer of interest. Thus, the term layer is not intended to denote a single layer consisting of a single material, but to encompass one or more materials layered in a composite manner to form the desired structure. One of ordinary skill in the art would recognize many variations, modifications, and alternatives.

In some embodiments, the first epitaxial N-type gallium nitride layer 1108 and the second epitaxial N-type gallium nitride layer 1110 may be formed on an engineered substrate as described herein. Because the engineered substrate includes a core (e.g., AlN) that may have a coefficient of thermal expansion (CTE) that is substantially matched to the CTE of the first epitaxial N-type gallium nitride layer 1108 and the second epitaxial N-type gallium nitride layer 1110, it may be possible to grow a relatively thick second epitaxial N-type gallium nitride layer and still maintain good crystalline quality. In some embodiments, the second epitaxial N-type gallium nitride layer 1110 may have a thickness ranging from about 10 μm to about 25 μm. The ability to deposit a relatively thick drift region by epitaxial growth on an engineered substrate may afford the vertical MPS diode 1100 low leakage current and a higher breakdown voltage, as well as many other advantages. The engineered substrate may be subsequently removed to expose a back surface of the first epitaxial N-type gallium nitride layer 1108 and facilitate the formation of the ohmic contact 1106.

On the other hand, the second epitaxial N-type gallium nitride layer 1110 may still be relatively thin to have a lower thermal resistance than those in GaN-based devices formed on a bulk single-crystalline GaN substrate, since bulk single-crystalline GaN substrates are usually relatively thick and cannot be removed. A lower thermal resistance may be advantageous for thermal management as heat is generated when current flows vertically through the vertical MPS diode 1100.

In some embodiments, the vertical MPS diode 1100 may further include a first edge termination region 1112 and a second edge termination region 1114, which may be referred to as junction termination extension (JTE) regions, coupled to the second epitaxial N-type gallium nitride layer 1110. The first edge termination region 1112 and the second edge termination region 1114 may be separated from each other by a portion 1110-1 of the second epitaxial N-type gallium nitride layer 1110. The vertical MPS diode 600 includes a plurality of grid regions 1105 in the portion 1110-1 of the second epitaxial N-type gallium nitride layer 1110. The plurality of grid regions 1105 are coupled to the Schottky contact 1116. In some embodiments, the plurality of grid regions 1105 may be formed by selective-area doping the portion 1110-1 of the second epitaxial N-type gallium nitride layer 110 by magnesium (Mg) ion diffusion as described herein. The Schottky contact 1116 may comprise, for example, TaN, WN, or other metals and metal alloys. The Schottky contact 1116 may overlap with the first edge termination region 1112 and the second edge termination region 1114.

According to some embodiments, the first edge termination region 1112 and the second edge termination region 1114, as well as the plurality of grid regions 1105, may be formed by doping a first portion and a second portion of the second epitaxial N-type gallium nitride layer 1110 by magnesium (Mg) ion diffusion. Thus, the first edge termination region 1112 and the second edge termination region 1114, as well as the plurality of grid regions 1105, may be P-type doped regions. The first edge termination region 1112 and the second edge termination region 1114 may extend laterally from the Schottky junction to the edge of the die, so that they may spread a field over a larger area. As such, the breakdown voltage of the vertical MPS diode 1100 may be increased.

The vertical MPS diode 1100 may further include a pad metal 1118 coupled to the Schottky contact 1116, and a bond wire 1120 electrically connected to the pad metal 1118. The pad metal 1118 may comprise, for example, palladium (Pd), gold (Au), silver (Ag), or other metals, or a combination thereof, or metal alloys. The vertical MPS diode 1100 may further include a metal tab 1102 for supporting the die via a die attach solder 1104. The metal tab 1102 may comprise, for example, copper (Cu), aluminum (Al), gold (Au), platinum (Pt), or other metals and metal alloys. The vertical MPS diode 1100 may also be encapsulated by a molding compound 1122.

Although some embodiments have been discussed in terms of a layer, the term layer should be understood such that a layer can include a number of sub-layers that are built up to form the layer of interest. Thus, the term layer is not intended to denote a single layer consisting of a single material, but to encompass one or more materials layered in a composite manner to form the desired structure. One of ordinary skill in the art would recognize many variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method of forming doped regions by diffusion in gallium nitride materials, the method comprising:
   providing a substrate structure including a gallium nitride layer;
   forming a mask on the gallium nitride layer, the mask exposing one or more portions of a top surface of the gallium nitride layer;
   depositing a magnesium-containing gallium nitride layer on the one or more portions of the top surface of the gallium nitride layer at a temperature ranging from about 900° C. to about 1100° C.;
   concurrently with depositing the magnesium-containing gallium nitride layer, forming one or more magnesium-doped regions in the gallium nitride layer by diffusing magnesium into the gallium nitride layer through the one or more portions, wherein the magnesium-containing gallium nitride layer provides a source of magnesium dopants;
   removing the magnesium-containing gallium nitride layer; and
   removing the mask.

2. The method of claim 1 wherein depositing the magnesium-containing gallium nitride layer is performed in a thin film deposition chamber.

3. The method of claim 1 wherein depositing the magnesium-containing gallium nitride layer is performed at a temperature ranging from about 1000° C. to about 1100° C.

4. The method of claim 1 wherein the magnesium-containing gallium nitride layer has a magnesium density ranging from about $1\times10^{19}$ cm$^{-3}$ to about $1\times10^{20}$ cm$^{-3}$.

5. The method of claim 1 wherein the substrate structure comprises:
   a buffer layer formed on a substrate;
   a first epitaxial gallium nitride layer formed on the buffer layer; and a second epitaxial gallium nitride layer formed on the first epitaxial gallium nitride layer;
wherein the one or more magnesium-doped regions are formed in the second epitaxial gallium nitride layer.

6. The method of claim 5 wherein the substrate comprises:
a polycrystalline ceramic core;
a barrier layer encapsulating the polycrystalline ceramic core;
a bonding layer coupled to the barrier layer; and
a substantially single crystalline layer coupled to the bonding layer.

7. The method of claim 5 wherein the second epitaxial gallium nitride layer is undoped before the magnesium-containing gallium nitride layer is deposited.

8. The method of claim 7 wherein the first epitaxial gallium nitride layer is N-type doped.

9. The method of claim 8 wherein each of the one or more magnesium-doped regions in the second epitaxial gallium nitride layer forms a p-n junction at an interface with the first epitaxial gallium nitride layer.

10. The method of claim 8 wherein the one or more magnesium-doped regions in the second epitaxial gallium nitride layer form portions of a merged p-i-n Schottky (MPS) diode.

11. The method of claim 10 wherein the one or more magnesium-doped regions in the second epitaxial gallium nitride layer form portions of a junction termination extension (JTE) for the MPS diode.

12. The method of claim 5 wherein two of the one or more magnesium-doped regions in the second epitaxial gallium nitride layer comprise a first edge termination region and a second edge termination region separated from each other by a portion of the second epitaxial gallium nitride layer, and the method further comprising:
forming a Schottky contact coupled to the portion of the second epitaxial gallium nitride layer, and to the first edge termination region and the second edge termination region.

13. The method of claim 1 wherein removing the magnesium-containing gallium nitride layer comprises removing an entirety of the magnesium-containing gallium nitride layer.

14. A method of forming doped regions in gallium nitride materials, the method comprising:
providing a gallium nitride substrate structure, the gallium nitride substrate structure including:
a buffer layer formed on a substrate;
a first epitaxial gallium nitride layer formed on the buffer layer;
a second epitaxial gallium nitride layer formed on the first epitaxial gallium nitride layer; and
an epitaxial aluminum gallium nitride layer formed on the second epitaxial gallium nitride layer;
forming a mask on the epitaxial aluminum gallium nitride layer, the mask exposing one or more portions of a top surface of the epitaxial aluminum gallium nitride layer;
depositing a magnesium-containing gallium nitride layer on the one or more portions of the top surface of the epitaxial aluminum gallium nitride layer;
concurrently with depositing the magnesium-containing gallium nitride layer, forming one or more magnesium-doped regions in the epitaxial aluminum gallium nitride layer by diffusing magnesium into the epitaxial aluminum gallium nitride layer through the one or more portions, wherein the magnesium-containing gallium nitride layer provides a source of magnesium dopants;
removing the magnesium-containing gallium nitride layer; and
removing the mask.

15. The method of claim 14 wherein depositing the magnesium-containing gallium nitride layer is performed in a thin film deposition chamber.

16. The method of claim 14 wherein depositing the magnesium-containing gallium nitride layer is performed at a temperature ranging from about 900° C. to about 1100° C.

17. The method of claim 14 wherein the magnesium-containing gallium nitride layer has a magnesium density ranging from about $1\times10^{19}$ cm$^{-3}$ to about $1\times10^{19}$ cm$^{-3}$.

18. The method of claim 14 wherein the substrate comprises:
a polycrystalline ceramic core;
a barrier layer encapsulating the polycrystalline ceramic core;
a bonding layer coupled to the barrier layer; and
a substantially single crystalline layer coupled to the bonding layer.

19. The method of claim 14 wherein the second epitaxial gallium nitride layer is undoped.

20. The method of claim 19 wherein the first epitaxial gallium nitride layer is N-type doped.

21. The method of claim 20 wherein each of the one or more magnesium-doped regions in the epitaxial aluminum gallium nitride layer forms an interface with the second epitaxial gallium nitride layer, and wherein the interface controls a threshold voltage of a high-electron-mobility transistor (HEMT) power device.

* * * * *